US011295991B2

(12) United States Patent
Yang et al.

(10) Patent No.: US 11,295,991 B2
(45) Date of Patent: Apr. 5, 2022

(54) COMPLEMENTARY CELL CIRCUITS EMPLOYING ISOLATION STRUCTURES FOR DEFECT REDUCTION AND RELATED METHODS OF FABRICATION

(71) Applicant: QUALCOMM Incorporated, San Diego, CA (US)

(72) Inventors: Haining Yang, San Diego, CA (US); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 160 days.

(21) Appl. No.: 16/798,947

(22) Filed: Feb. 24, 2020

(65) Prior Publication Data

US 2021/0265223 A1 Aug. 26, 2021

(51) Int. Cl.
*H01L 21/8238* (2006.01)
*H01L 21/762* (2006.01)
(Continued)

(52) U.S. Cl.
CPC ........ *H01L 21/823878* (2013.01); *H01L 21/76224* (2013.01); *H01L 21/823821* (2013.01); *H01L 27/0207* (2013.01); *H01L 27/0924* (2013.01)

(58) Field of Classification Search
CPC ....... H01L 21/823878; H01L 21/76224; H01L 21/823821; H01L 27/0207; H01L 27/0924;
(Continued)

(56) References Cited

U.S. PATENT DOCUMENTS 10,177,039 B2 * 1/2019 Greene ........... H01L 21/823475
2016/0254261 A1 9/2016 Machkaoutsan et al.
(Continued)

FOREIGN PATENT DOCUMENTS

WO 2018063333 A1 4/2018

OTHER PUBLICATIONS

International Search Report and Written Opinion for International Patent Application No. PCT/US2021/013168, dated May 10, 2021, 19 pages.
(Continued)

*Primary Examiner* — Karen Kusumakar
*Assistant Examiner* — Adam S Bowen
(74) *Attorney, Agent, or Firm* — QUALCOMM Incorporated

(57) ABSTRACT

To prevent short defects between source/drains of transistors of a complementary cell circuit, isolation walls are formed in an isolation region between the source/drains of the transistors prior to growing a P-type epitaxial layer and an N-type epitaxial layer on respective sides of the isolation region. The isolation walls provide a physical barrier to prevent formation of short defects that can otherwise form between the P-type and N-type epitaxial layers. Thus, the isolation walls prevent circuit failures resulting from electrical shorts between source/drain regions of transistors in complementary cell circuits. A width of the isolation region between a P-type transistor and an N-type transistor in a circuit cell layout can be reduced so that a total layout area of the complementary cell circuit can be reduced without reducing product yield. A gate cut may be formed in the dummy gate with a process of forming the isolation walls.

20 Claims, 27 Drawing Sheets

(51) Int. Cl.
*H01L 27/02* (2006.01)
*H01L 27/092* (2006.01)

(58) Field of Classification Search
CPC ..... H01L 21/823828; H01L 21/823814; H01L 27/092
See application file for complete search history.

(56) References Cited

U.S. PATENT DOCUMENTS

| | | | |
|---|---|---|---|
| 2017/0117411 A1* | 4/2017 | Kim | H01L 21/823821 |
| 2017/0178976 A1 | 6/2017 | Kanakasabapathy et al. | |
| 2018/0114730 A1* | 4/2018 | Peng | H01L 21/823807 |
| 2019/0067417 A1 | 2/2019 | Ching et al. | |
| 2020/0043945 A1* | 2/2020 | Kim | H01L 27/11807 |
| 2020/0098681 A1* | 3/2020 | Kim | H01L 27/0924 |
| 2021/0249313 A1* | 8/2021 | Chen | H01L 27/0924 |

OTHER PUBLICATIONS

Loubet, N. et al., "Stacked Nanosheet Gate-All-Around Transistor to Enable Scaling Beyond FinFET," 2017 Symposium on VLSI Technology Digest of Technical Papers, Jun. 2017, Kyoto, Japan, JSAP, pp. T230-T231.

* cited by examiner

US 11,295,991 B2

COMPLEMENTARY CELL CIRCUITS EMPLOYING ISOLATION STRUCTURES FOR DEFECT REDUCTION AND RELATED METHODS OF FABRICATION

BACKGROUND

I. Field of the Disclosure

The field of the disclosure relates to complementary circuits that include N-type and P-type transistors to form integrated circuits (ICs) and, more particularly, to avoiding short defects when fabricating a circuit with N-type and P-type transistors.

II. Background

Integrated circuits (ICs) employ large numbers of transistors, which are essential to providing the many functions performed by electronic devices. For example, IC components such as central processing units (CPUs), digital signal processors (DSPs), and memory systems each employ large quantities of transistors in logic circuits and memory circuits. As the functions of electronic devices become more complex, the number of transistors needed to perform such functions increases. There is demand for electronic devices, such as mobile devices, to perform functions more quickly while simultaneously becoming smaller in size. To respond to these demands, the ICs within such devices, and the transistors within those ICs, must be made smaller. The area occupied by transistor circuits in ICs is minimized by efficiently arranging circuits. In this regard, IC developers employ standard cells, which are transistors and interconnect structures that provide a function (e.g., Boolean or memory) and have layouts determined to optimize area. Standard cell layouts reduce unused space. However, making standard cell circuit layouts smaller requires positioning circuit elements closer together, which creates certain technological challenges. One aspect of those challenges is explained with reference to the circuit layout example in FIG. 1.

FIG. 1 is an illustration of a standard cell circuit layout 100 of an inverter circuit 102. The inverter circuit 102 is an example of a complementary metal-oxide semiconductor (MOS) (CMOS) cell circuit, or complementary cell circuit, which employs one or more P-type transistors and one or more N-type transistors (e.g., in a complementary manner). In FIG. 1 a P-type transistor 104 for the inverter circuit 102 is formed in a P-type diffusion region ("P-type region") 106, which is a region of the surface of a semiconductor substrate 108, such as silicon, that is lightly doped with a trivalent impurity to create a large number of holes within the semiconductor substrate 108. An N-type transistor 110 is formed in an N-type diffusion region ("N-type region") 112, which is a region of the semiconductor substrate 108 that is lightly doped with a pentavalent impurity to create a large number of free electrons. Between the P-type region 106 and the N-type region 112 is an isolation region 114 having a width $W_{ISO}$. The isolation region 114 is an undoped region of the semiconductor substrate 108 that isolates the P-type region 106 on one side of the isolation region 114 from the N-type region 112 on the other side. The P-type transistor 104 includes a source 116P, a drain 118P, and a channel 120P. The N-type transistor 110 includes a source 116N, a drain 118N, and a channel 120N. In the example of the inverter circuit 102 as shown in FIG. 1, both the P-type transistor 104 and the N-type transistor 110 are coupled to a common gate 122. The gate 122 spans both of the channel 120P and the channel 120N to control operation of the P-type transistor 104 and the N-type transistor 110 by a voltage applied to the gate 122. Details of operation of the inverter circuit 102 are understood by persons of ordinary skill and are, therefore, not discussed further herein.

The sources 116P, 116N and the drains 118P, 118N of the P-type transistor 104 and the N-type transistor 110 are formed of a crystal material having properties that are beneficial to CMOS circuits. Silicon crystal material, for example, is formed by silicon epitaxial deposition, or epitaxy, which is a process of growing a crystalline epitaxial layer on a substrate. The source 116P and the drain 118P of the P-type transistor 104 are formed in the P-type region 106 in a first epitaxial process, and the source 116N and the drain 118N of the N-type transistor 110 are formed in the N-type region 112 in a second epitaxial process. As a crystalline structure grows vertically, it also extends horizontally. Thus, in the inverter circuit 102, an epitaxial layer in the source 112P of the P-type transistor 104 extends above the isolation region 114 (e.g., horizontally) towards the N-type transistor 110. Similarly, an epitaxial layer in the source 116N of the N-type transistor 110 extends above the isolation region 114 towards the P-type transistor 104.

One approach to minimizing the area occupied by the standard cell circuit layout 100 is to reduce the width $W_{ISO}$ of the isolation region 114, which reduces a distance between portions of the epitaxial layers of the sources 116P, 116N and the drains 118P, 118N extending above the isolation region 114. However, physical limitations of photolithographic methods and epitaxial growth processes present challenges to further decreasing the geometries of transistors in this regard. Small variations in those processes can result in defects that cause, for example, short circuits that lead to circuit failure. Thus, problems with process variation occurring in fabrication of planar and three-dimensional transistors are an obstacle to further reducing circuit area.

SUMMARY OF THE DISCLOSURE

Aspects disclosed herein include complementary cell circuits employing isolation structures for defect reduction. Related methods of fabricating complementary cell circuits that employ such isolation structures are also disclosed. As the distance between a P-type region and an N-type region of a complementary cell circuit is reduced in an effort to reduce circuit area, there is an increase in the number of short defects caused by process variations. In exemplary aspects disclosed herein, to reduce or avoid short defects between sources and drains (source/drains) of adjacent P-type and N-type transistors of a complementary cell circuit, isolation walls are formed in an isolation region between the source/drains of the P-type and N-type transistors. These isolation walls can be formed prior to growing a P-type epitaxial layer and an N-type epitaxial layer on respective sides of the isolation region. The isolation walls serve to limit growth of the respective epitaxial layers in a direction extending above the isolation region. The isolation walls provide a physical barrier to prevent formation of short defects that can otherwise form between the P-type and N-type epitaxial layers. Thus, the isolation walls can prevent circuit failures resulting from electrical shorts between source/drain regions of transistors in complementary cell circuits. In this manner, a width of the isolation region between a P-type transistor and an N-type transistor in a circuit cell layout can be reduced so that a total layout area of the complementary cell circuit can be reduced without reducing product yield. In another exemplary aspect, a gate cut, which is an isolation structure that electrically isolates a gate of a complementary cell circuit from a gate of an adjacent cell circuit, may be formed with the isolation walls.

In a first aspect, a complementary cell circuit is disclosed. The complementary cell circuit includes a semiconductor substrate including a P-type region, an N-type region, and an isolation region between the P-type region and the N-type region, the isolation region having a width extending in a direction of a first axis. The complementary cell circuit further includes a gate extending longitudinally in the direction of the first axis, the gate extending across portions of each of the P-type region, the isolation region, and the N-type region. The complementary cell circuit includes a first P-type epitaxial (epi) source/drain (S/D) (epi-S/D) formed on the P-type region on a first side of the gate, the first P-type epi-S/D extending above the isolation region in a first direction of the first axis, and a first N-type epi-S/D formed on the N-type region on the first side of the gate, the first N-type epi-S/D extending above the isolation region in a second direction of the first axis. The complementary cell circuit includes a first isolation wall on the first side of the gate extending from the isolation region in a third direction orthogonal to the first axis, the first isolation wall isolating the first P-type epi-S/D from the first N-type epi-S/D, The complementary cell circuit includes a second P-type epi-S/D formed on the P-type region on a second side of the gate, the second P-type epi-S/D extending above the isolation region in the first direction of the first axis, and a second N-type epi-S/D formed on the N-type region on the second side of the gate, the second. N-type epi-S/D extending above the isolation region in the second direction of the first axis. The complementary cell circuit includes a second isolation wall on the second side of the gate extending from the isolation region in the third direction orthogonal to the first axis, the second isolation wall isolating the second P-type epi-S/D from the second N-type epi-S/D.

In another aspect, a method of forming a complementary cell circuit including isolation structures is disclosed. The method includes forming a P-type region on a first side of an isolation region extending longitudinally in a first direction on a semiconductor substrate and forming an N-type region on a second side of the isolation region on the semiconductor substrate. The method includes forming a dummy gate extending longitudinally in a second direction orthogonal to the first direction and extending across portions of the P-type region, the isolation region, and the N-type region. The method includes depositing a dielectric layer on the P-type region, the isolation region, and the N-type region on a first side and a second side of the dummy gate, and etching a first trench through the dielectric layer on the first side of the dummy gate and a second trench through the dielectric layer on the second side of the dummy gate. The method includes forming isolation structures, including filling the first trench with an isolation material to form a first isolation wall, and filling the second trench with the isolation material to form a second isolation wall. The method includes forming a first N-type epi-S/D on the N-type region on the first side of the dummy gate, the first N-type epi-S/D extending above the isolation region on a first side of the first isolation wall, and forming a second N-type epi-S/D on the N-type region on the second side of the dummy gate, the second N-type epi-S/D extending above the isolation region on a first side of the second isolation wall. The method also includes forming a first P-type epi-S/D on the P-type region on the first side of the dummy gate, the first P-type epi-S/D extending above the isolation region on a second side of the first isolation wall and isolated from the first N-type epi-S/D by the first isolation wall, and forming a second P-type epi-S/D on the P-type region on the second side of the dummy gate, the second P-type epi-S/D extending above the isolation region on a second side of the second isolation wall and isolated from the second N-type epi-S/D by the second isolation wall.

DETAILED DESCRIPTION

Figure 1:
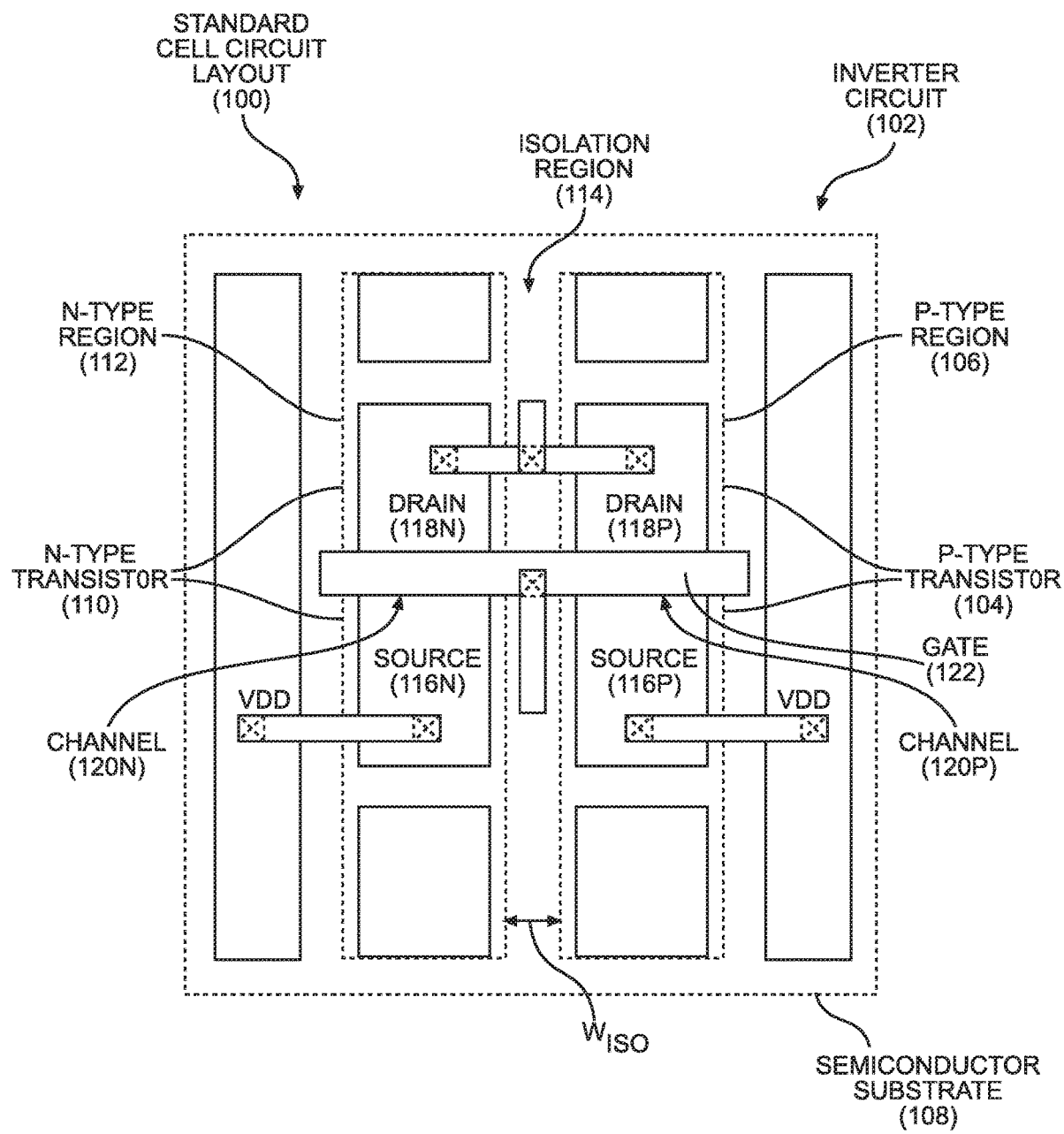
FIG. 1 is a top view of a standard cell layout for one example of a conventional complementary cell circuit including a P-type diffusion region ("P-type region") and an N-type diffusion region ("N-type region") formed on a substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include complementary cell circuits employing isolation structures for defect reduction. Related methods of fabricating complementary cell circuits that employ such isolation structures are also disclosed. As the distance between a P-type region and an N-type region of a complementary cell circuit is reduced in an effort to reduce circuit area, there is an increase in the number of short defects caused by process variations. In exemplary aspects disclosed herein, to reduce or avoid short defects between sources and drains (source/drains) of adjacent P-type and N-type transistors of a complementary cell circuit, isolation walls are formed in an isolation region between the source/drains of the P-type and N-type transistors. These isolation walls can be formed prior to growing a P-type epitaxial layer and an N-type epitaxial layer on respective sides of the isolation region. The isolation walls serve to limit growth of the respective epitaxial layers in a direction extending above the isolation region. The isolation walls provide a physical barrier to prevent formation of short defects that can otherwise form between the P-type and N-type epitaxial layers. Thus, the isolation walls can prevent circuit failures resulting from electrical shorts between source/drain regions of transistors in complementary cell circuits. In this manner, a width of the isolation region between a P-type transistor and an N-type transistor in a circuit cell layout can be reduced so that a total layout area of the complementary cell circuit can be reduced without reducing product yield. In another exemplary aspect, a gate cut, which is an isolation structure that electrically isolates a gate of a complementary cell circuit from a gate of an adjacent cell circuit, may be formed with the isolation walls.

Figure 2A:
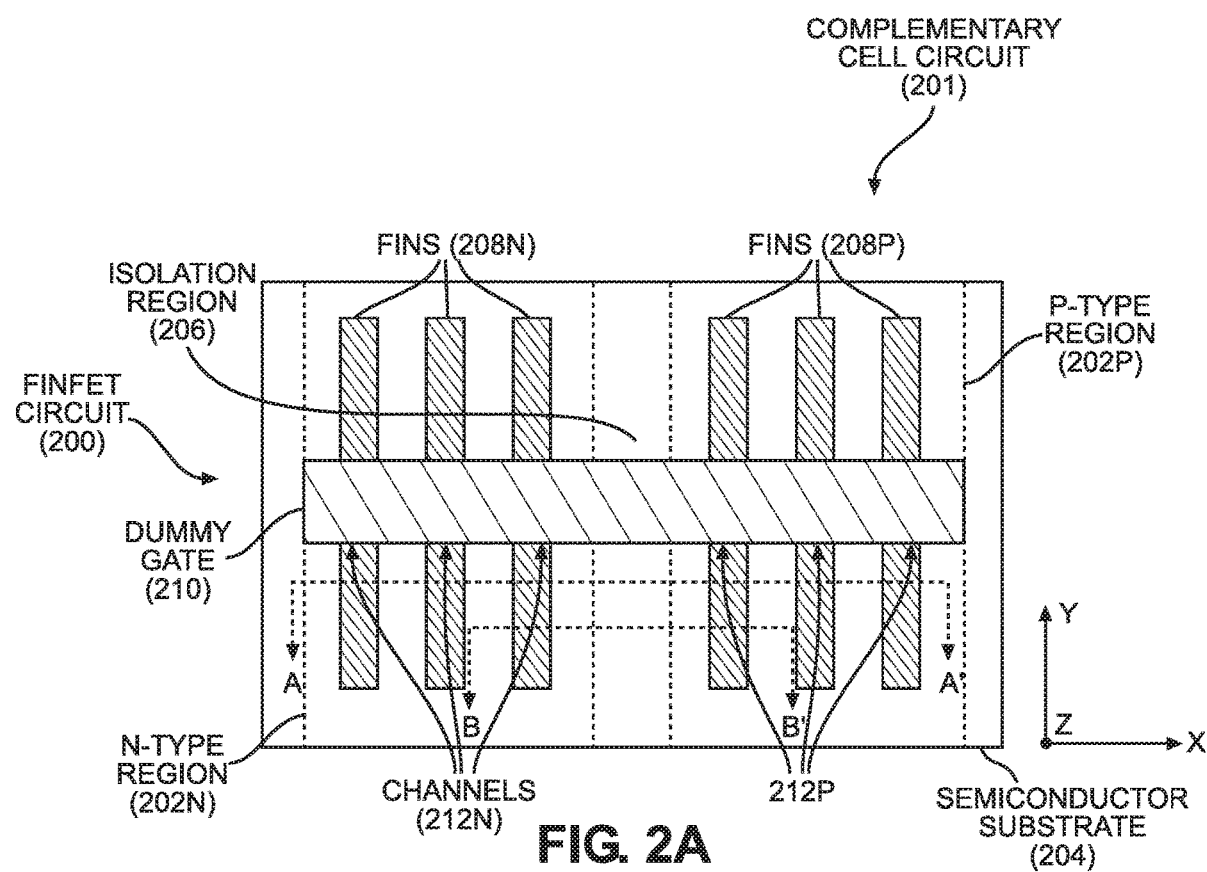
FIG. 2A is a top view in a fabrication stage of a complementary cell circuit comprising fins for a P-type Fin Field-Effect Transistor (FET) (FinFET) (PFET) and an N-type FinFET (NFET) across which a dummy gate has been formed.
Figure 2B:
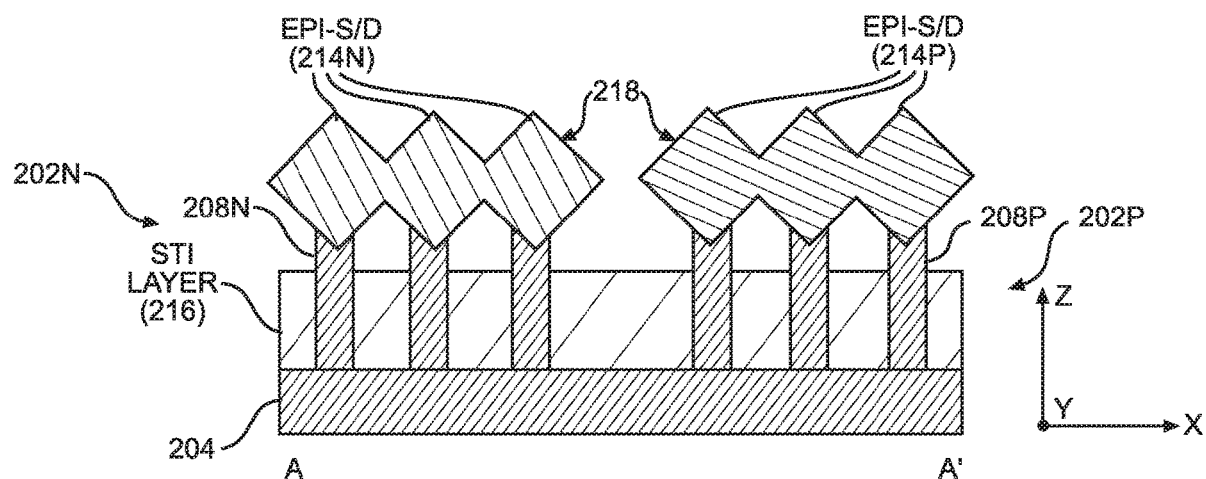
FIG. 2B is a cross-sectional side view of the complementary cell circuit in FIG. 2A at a fabrication stage subsequent to formation of epitaxial regions on the P-type and N-type fins without a short defect resulting from process variations.
Figure 2C:
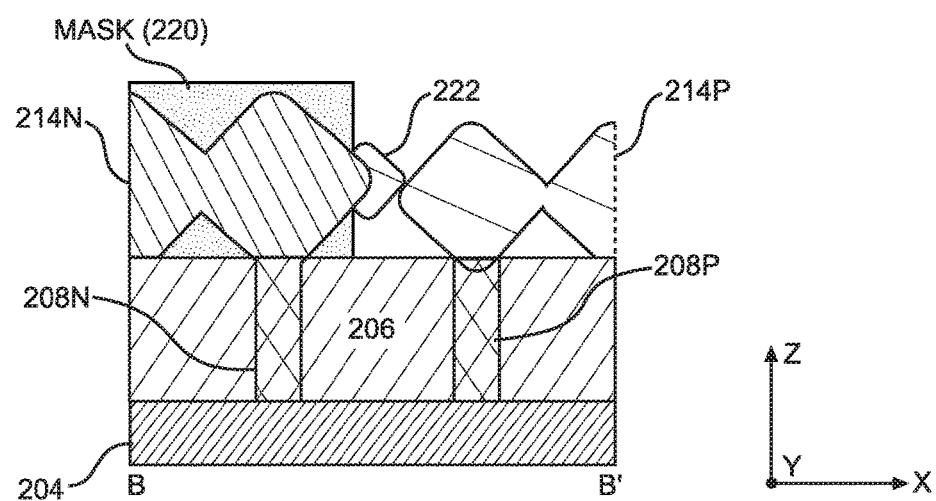
FIG. 2C is a cross-sectional side view of the complementary cell circuit in FIG. 2A at a fabrication stage subsequent to formation of epitaxial regions on the P-type and N-type fins including a short defect resulting from process variations.
Figure 3A:
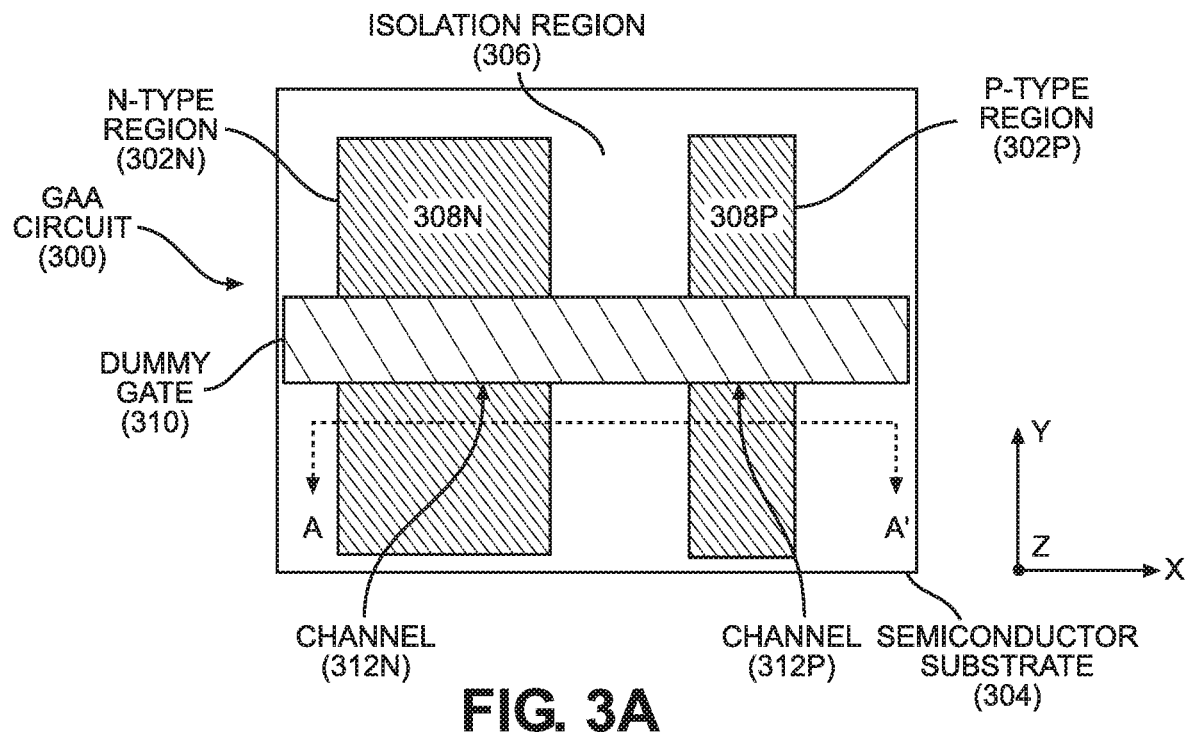
FIG. 3A is a top view in a fabrication stage of a complementary cell circuit comprising a P-type gate-all-around (GAA) region and an N-type GAA region across which a dummy gate has been formed.
Figure 3B:
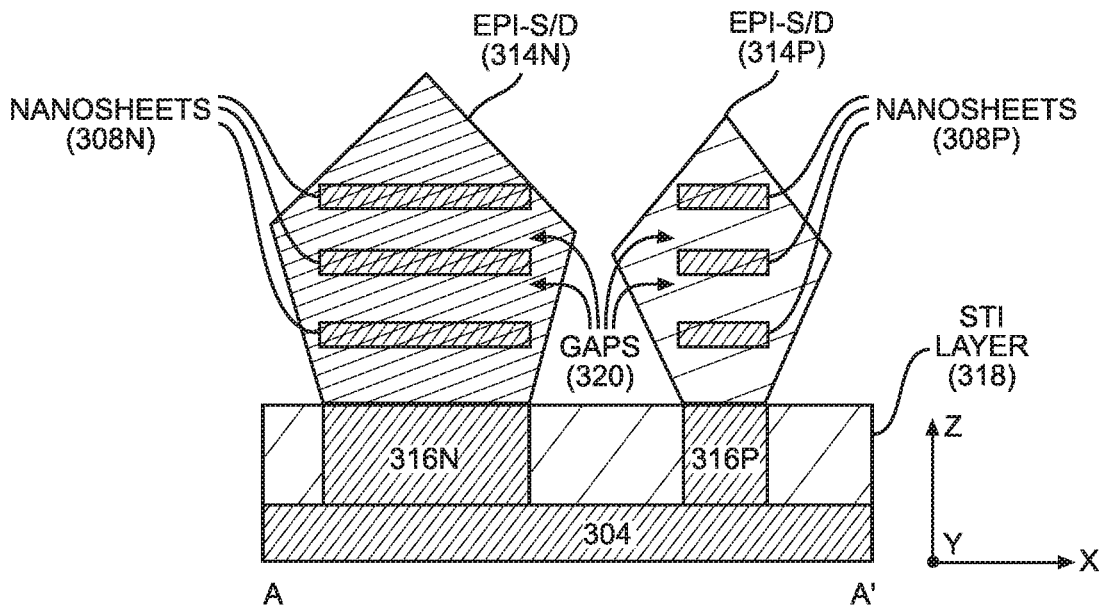
FIG. 3B is a cross-sectional side view of the complementary cell circuit in FIG. 3A at a fabrication stage subsequent to formation of epitaxial regions on the P-type and N-type GAA regions without a short defect resulting from process variations.
Figure 3C:
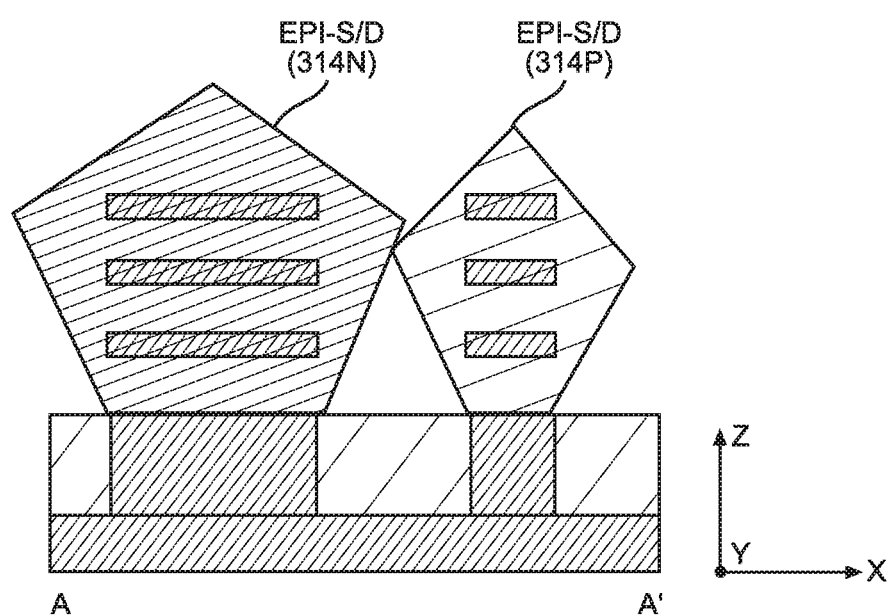
FIG. 3C is a cross-sectional side view of the complementary cell circuit in FIG. 3A at a fabrication stage subsequent to formation of epitaxial regions on the P-type and N-type GAA regions including a short defect resulting from process variations.
Figure 4A:
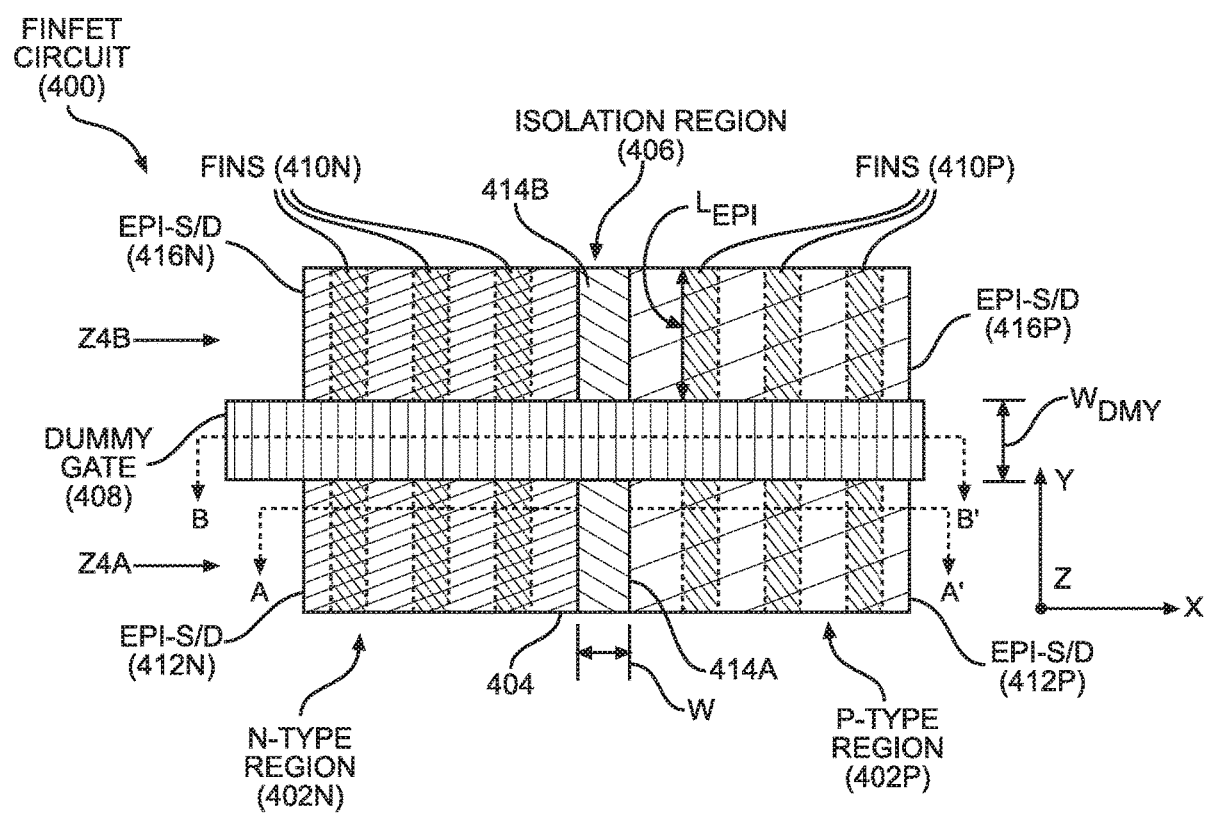
FIG. 4A is a top view of an exemplary complementary cell circuit comprising fins for a HET and an NFET on a substrate across which a dummy gate has been formed, and comprising isolation walls formed between P-type and N-type regions (i.e., regions where source/drains (S/Ds) of the PFET and the NFET are grown) to prevent short defects resulting from process variations in the formation of epitaxial layers.

Before discussing examples of complementary cell circuits that include isolation walls formed between P-type and N-type regions where source/drains (S/Ds) of the PFET and the NFET can be grown to prevent or reduce short defects resulting from process variations in the formation of epitaxial layers starting at FIG. 4A, examples of complementary cell circuits of different three-dimensional (3D) transistors that do not include such isolation walls are first illustrated in FIGS. 2A-2C and 3A-3C and discussed.

FIGS. 2A-2C illustrate an example of a complementary cell circuit 201 that includes a Fin Field-Effect Transistor (MT) (FinFET) circuit 202. FIG. 2A is a top view of the FinFET circuit 200 including a P-type region 202P and an N-type region 202N of a semiconductor substrate 204. The P-type region 202P and the N-type region 202N are on opposite sides of an isolation region 206. The semiconductor substrate 204 extends in a plane including an X-axis and a Y-axis orthogonal to each other. Fins 208P and 208N extend longitudinally in a direction substantially parallel to the Y-axis ("Y-axis direction"), and a dummy gate 210 extends longitudinally in a direction substantially parallel to the X-axis ("X-axis direction"). The dummy gate 210 is formed across channels 212P and 212N of the fins 208P and 208N. In this context, "substantially parallel" means parallel or within a few degrees (e.g., 3 degrees) of variation from parallel.

FIG. 2B is a side view at cross-section A-A' of FIG. 2A after epitaxial (epi) source/drains (S/Ds) epi-S/Ds 214P and 214N are formed on the fins 208P and 208N, respectively. FIG. 2B shows that the fins 208P extend in a Z-axis direction from the P-type region 202P, orthogonal to the plane of the semiconductor substrate 204, and the fins 208N extend in the Z-axis direction from the N-type region 202N. A shallow trench isolation (STI) layer 216 is deposited between the fins 208P and 208N. As the crystalline structure 218 of the epi-S/Ds 214P and 214N grows on the fins 208P and 208N, the epi-S/Ds 214P and 214N extend horizontally and couple to the crystalline structures 218 on adjacent fins 208P and 208N. The extent of such growth is determined by various factors including time and loading effects. To keep the epi-S/Ds 214P separate from the epi-S/Ds 214N, the isolation region 206 is provided between the P-type region 202P and the N-type region 202N. In a normal process, a time for growth of the crystalline structures 218 is set to allow the epi-S/Ds 214P and 214N to extend horizontally far enough to couple to each other, but not far enough to extend across the isolation region 206.

FIG. 2C is another cross-sectional side view, along line B-B' in FIG. 2A, after a short defect is formed due to process variations. To explain how the short defect in FIG. 2C is created, a high-level description of processes for forming the epi-S/Ds 214P and 214N is provided. A first mask (not shown) is formed on the fins 208P in FIG. 2A. In a first epitaxial growth process, the epi-S/Ds 214N are formed on the fins 208N. Next, the first mask is removed from the recessed fins 208P, and a second mask 220 is formed on the epi-S/Ds 214N. The second mask 220 extends horizontally into the isolation region 206 to a point that is farther than an epi-S/D 214N would horizontally extend assuming no process variation has affected the size of the epi-S/D 214N. The extent of the second mask 220 is based on an expected size of the crystalline structure 218. Then, in a second epitaxial growth process, the epi-S/Ds 214P are formed on the fins 208P.

Certain process factors (e.g., loading effects) may vary during the first epitaxial growth process. As a result, the epi-S/Ds 214N in FIG. 2C are larger than expected. As a result, the second mask 220 does not extend far enough horizontally above the isolation region 206 to fully cover the epi-S/D 214N. Hence, there is an exposed portion of the epi-S/D 214N not covered by the second mask 220 and, in the second epitaxial growth process, an unintended crystalline structure 222 is also formed on the exposed portion of the epi-S/D 214N. The crystalline structure 222 extends horizontally across the isolation region 206 and comes into contact with the epi-S/D 214P, creating an electrical connection or short defect. As a result, the FinFET circuit 200 fails to operate as expected.

In a second example of a complementary cell circuit, a gate-all-around (GAA) circuit 300 is illustrated in FIGS. 3A-3C. FIG. 3A is a top view of the GAA circuit 300 including P-type region 302P and N-type region 302N on a semiconductor substrate 304. The P-type region 302P and the N-type region 302N are on opposite sides of an isolation region 306. The P-type region 302P and the N-type region 302N include nanosheets (or nanoslabs) 308P and 308N, respectively. The semiconductor substrate 304 extends in a plane including an X-axis and a Y-axis orthogonal to each other. The P-type region 302P and the N-type region 302N each extend longitudinally in a Y-axis direction, and a dummy gate 310 extends longitudinally in an X-axis direction. The dummy gate 310 is formed on channels 312P and 312N of the P-type region 302P and the N-type region 302N, respectively.

FIG. 3B is a side view at cross-section A-A' of FIG. 3A after epi-S/Ds 314P and 314N are formed on the nanosheets 308P and 308N, respectively. As shown in FIG. 3B, the epi-S/Ds 314P and 314N are also formed on P-type and N-type portions 316P and 316N, respectively, extending in a Z-axis direction from the semiconductor substrate 304. A STI layer 318 is deposited between the P-type and N-type portions 316P and 316N. Positioned above the P-type and N-type portions 316P and 316N in the Z-axis direction are the nanosheets 308P and 308N, which are separated from each other by gaps 320. N-type epi-S/D 314N is formed on N-type portion 316N and nanosheets 308N in a first epitaxial growth process. P-type epi-S/D 314P is formed on P-type portion 316P and nanosheets 308P in a second epitaxial growth process. In the first epitaxial growth process, similar to the first epitaxial growth process described with respect to FIG. 2C, the N-type epi-S/D 314N is grown to an intended size extending horizontally above the isolation region 306 in a Y-axis direction toward the P-type region 302P. In the second epitaxial growth process, the P-type epi-S/D 314P is grown to an intended size extending horizontally above the isolation region 306 in a Y-axis direction toward the N-type region 302N. No short defects are present in the GAA circuit 300 in FIG. 3B.

FIG. 3C is another side view at cross-section A-A' of FIG. 3A after a short defect is formed due to process variations. The process flow for forming epi-S/Ds 314N and 314P is similar to the process described with reference to FIG. 2C, above. In FIG. 3C, the epi-S/D 314N is larger than expected due to process variations, extending farther horizontally across the isolation region 306 than expected. As a result, the normally grown epi-S/D 314P, which also extends horizontally across the isolation region 306, comes into contact with the over-sized epi-S/D 314N, creating an electrical connection or short defect. As a result, the GAA circuit 300 fails to operate as expected.

Figure 4B:
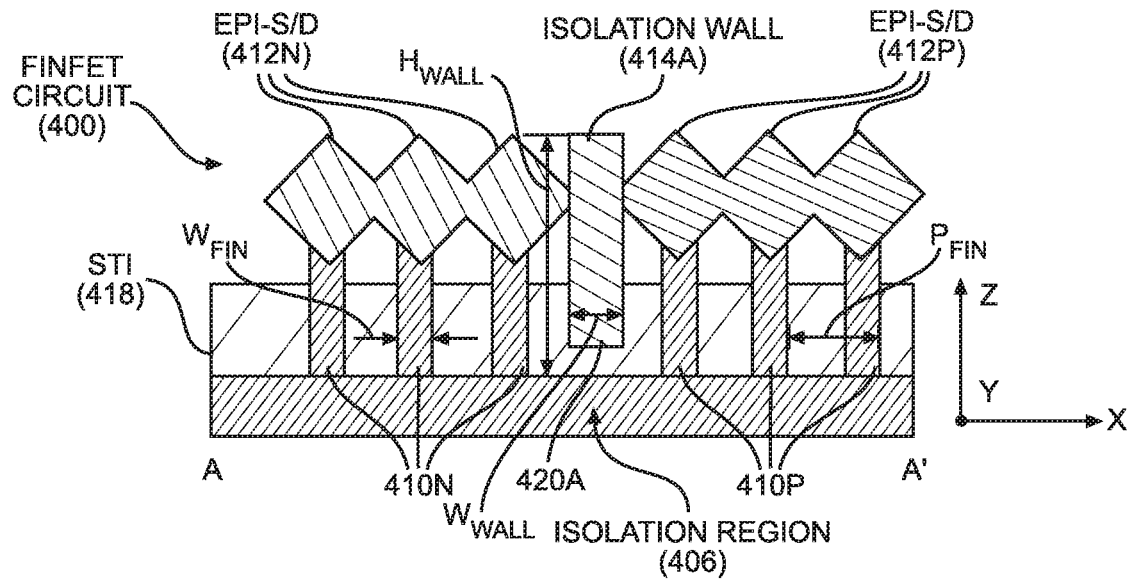
FIG. 4B is a cross-sectional side view of the exemplary complementary cell circuit in FIG. 4A illustrating an isolation wall providing a barrier to growth of epitaxial S/D material in a direction above the isolation region.
Figure 4C:
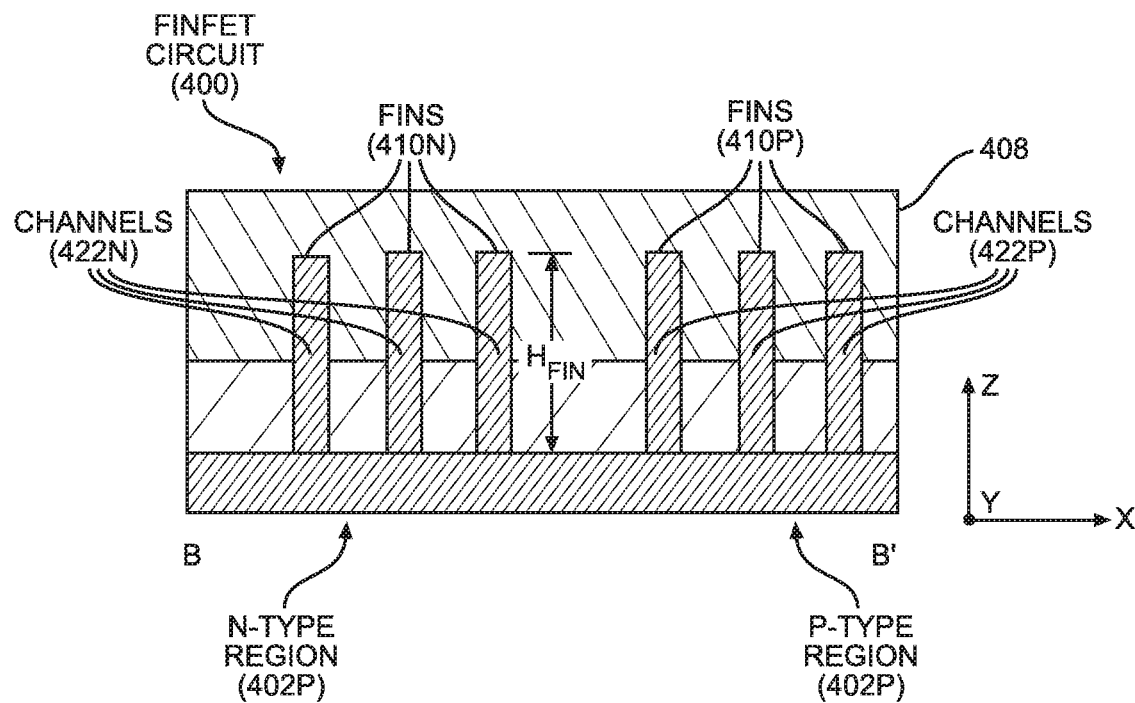
FIG. 4C is a cross-sectional side view of the exemplary complementary cell circuit in FIG. 4A showing that isolation walls are not formed in the dummy gate.

FIGS. 4A-4C are views of an exemplary FinFET circuit 400 that is one example of a complementary cell circuit including isolation walls formed in an isolation region between P-type and N-type transistors to limit growth of epitaxial layers of the respective transistors in a direction extending above the isolation region, as disclosed herein. FIG. 4A is a top view of the FinFET circuit 400 including a P-type region 402P and an N-type region 402N of a semiconductor substrate 404 that extends in a plane including an X-axis and a Y-axis. The semiconductor substrate 404 includes an isolation region 406 between the P-type region 402P and the N-type region 402N. The isolation region 406 has a width W extending in a direction of the X-axis ("X-axis direction"). The FinFET circuit 400 includes a dummy gate 408 extending longitudinally in the X-axis direction across portions of the P-type region 402P, the isolation region 406, and the N-type region 402N. In the completed FinFET circuit 400, the dummy gate 408 is replaced by a conductive gate for controlling transistors formed by the P-type region 402P and the N-type region 402N. The P-type region 402P includes fins 410P extending in a Y-axis direction. The N-type region 402N includes fins 410N extending in the Y-axis direction.

With reference to the FinFET circuit 400 in FIG. 4A, an epi-S/D 412P is formed on the fins 410P in the P-type region 402P on a side Z4A of the dummy gate 408. The epi-S/D 412P extends above the isolation region 406 in a first X-axis direction (i.e., toward the N-type region 402N). An epi-S/D 412N is formed on the fins 410N in the N-type region 402N on the side Z4A of the dummy gate 408, and the epi-S/D 412N extends above the isolation region 406 in a second X-axis direction (i.e., toward the P-type region 402P). The isolation region 406 includes an isolation wall 414A on the side Z4A of the dummy gate 408. The isolation wall 414A extends from the isolation region 406 in a Z-axis direction to a height $H_{WALL}$, that is tall enough to block the epi-S/Ds 412N and 416N from contacting the epi-S/Ds 412P and 416P above the isolation region 406.

The isolation wall 414A is formed in the isolation region 406 before the epi-S/D 412P and the epi-S/D 412N are grown. The isolation wall 414A is inserted between the spaces that would be occupied by a short defect if either of the epi-S/D 412P or the epi-S/D 412N are incorrectly grown due to process variations. Rather than relying solely on the accuracy of fabrication (e.g., photolithographic) processes to avoid short defects, the isolation wall 414A is a physical barrier that prevents or at least reduces the creation of short defects even when process variations do occur.

With further reference to the FinFET circuit 400 in FIG. 4A an epi-S/D 416P is formed on the fins 410P in the P-type region 402P on a side Z4B of the dummy gate 408. The epi-S/D 416P extends above the isolation region 406 in the first X-axis direction (i.e., toward the N-type region 402N). An epi-S/D 416N is formed on the fins 410N in the N-type region 402N on the side Z4B of the dummy gate 408 and the epi-S/D 416N extends above the isolation region 406 in the second X-axis direction (i.e., toward the P-type region 402P). The isolation region 406 also includes an isolation wall 414B on the side Z4B of the dummy gate 408 that extends to the height $H_{WALL}$ from the isolation region 406 in the Z-axis direction (e.g., orthogonal to the dummy gate 408). The isolation wall 414B isolates the epi-S/D 416P from the epi-S/D 416N. The isolation wall 414A and the isolation wall 414B may be formed of at least one of Silicon Nitride (SiN), Silicon Oxi-Nitride (SiON), Silicon Carbide (SiC), and Aluminum Oxide (AlO) for example, or other isolation material for providing electrical isolation.

FIG. 4B is a cross-sectional side view at line A-A' of the FinFET circuit 400 in FIG. 4A. In FIG. 4B, a STI 418 is formed between the respective fins 410P and 410N, including in the isolation region 406. Here, it can be seen that the horizontal growth of the epi-S/Ds 412P and 412N in the X-axis direction above the isolation region 406 is limited by the isolation wall 414A. In this regard, the epi-S/Ds 412P and 412N are prevented from forming short defects even in the presence of a process variation in which the epi-S/Ds 412N resulting from the epitaxial growth process become larger than intended. In addition, because the isolation of the epi-S/Ds 412N during a second epitaxial growth process, in which the epi-S/Ds 412P are formed, is not provided solely, by a mask that is based on an expected size of the epi-S/Ds 412N, short defects cannot be created during formation of the epi-S/Ds 412P. As shown in FIG. 4B, a bottom end 420A of the isolation wall 414A is below the top surface of the isolation region 406, which is a top surface of the STI 418.

In one non-limiting example, the FinFET circuit 400 may be formed with the following dimensions. The isolation walls 414A and 414B have a width $W_{WALL}$, in the range of 10 nanometers (nm) to 30 nm. The isolation walls 414A and 414B extend to a height $H_{WALL}$ in the range of 50 nm to 150 nm above the substrate 406 to correspond to a height $H_{FIN}$ of the fins 410N and 410P above the substrate 406 (see FIG. 4C), The fins 410N and 410P each have a fin width $W_{FIN}$ in the range of 3 nm to 12 nm and are separated at a pitch $P_{FIN}$ of 15 nm to 40 nm. The epi-S/Ds 416P, 416N, 412P, 412N are formed on portions of the fins 410N and 410P extending orthogonally for a length $L_{EPI}$ (see FIG. 4A) of 30 nm to 80 nm from the dummy gate 408. The dummy gate 408 has a width $W_{DMY}$ of 6 nm to 200 nm.

FIG. 4C is a cross-sectional side view at line B-B' of the FinFET circuit 400 (i.e., complementary cell circuit) FIG. 4A. FIG. 4C shows that the dummy gate 408 is formed across channels 422P and 422N of the fins 410P and 410N, respectively. FIG. 4C also shows that the FinFET circuit 400 does not have an isolation wall in the dummy gate 408 between the P-type region 402P and the N-type region 402N.

In the FinFET circuit 400 in FIGS. 4A-4C, the N-type region 402N includes the N-type fins 410N extending in the Z-axis direction from the semiconductor substrate 404. The N-type epi-S/D 412N and the N-type epi-S/I) 416N are formed on the N-type fins 410N. The P-type region 402P includes the P-type fins 410P extending in the Z-axis direction from the semiconductor substrate 404, The P-type epi-S/D 412P and the P-type epi-S/D 416P are formed on the P-type fins 410P. Thus, forming the N-type region 402N includes forming N-type fins 410N extending orthogonal to (i.e., in the Z-axis direction) the semiconductor substrate 404, and forming the P-type region 402P includes forming P-type fins 410P extending orthogonal to (i.e., in the Z-axis direction) the semiconductor substrate 404.

Figure 5A:
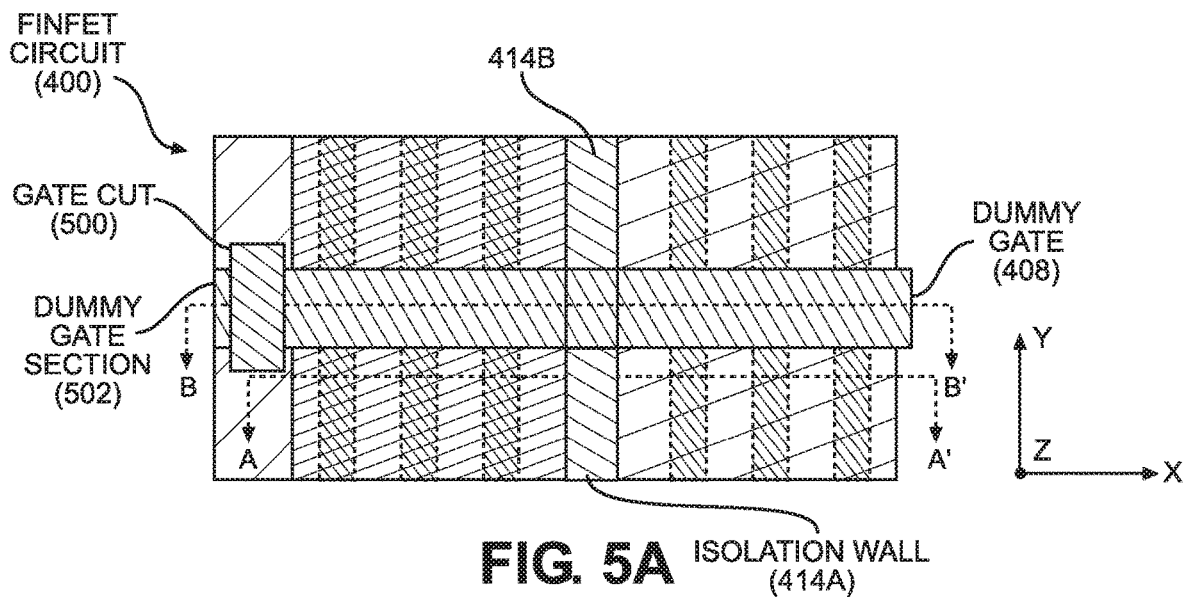
FIG. 5A is a top view in a fabrication stage of an exemplary complementary cell circuit comprising fins for a PFET and an NFET on a substrate and including a dummy gate, the complementary cell circuit including isolation walls formed between S/D regions of the PFET and the NFET and a gate cut formed at one end of the dummy gate to isolate the gate of the complementary cell circuit in FIG. 5A from a gate of an adjacent circuit.
Figure 5B:
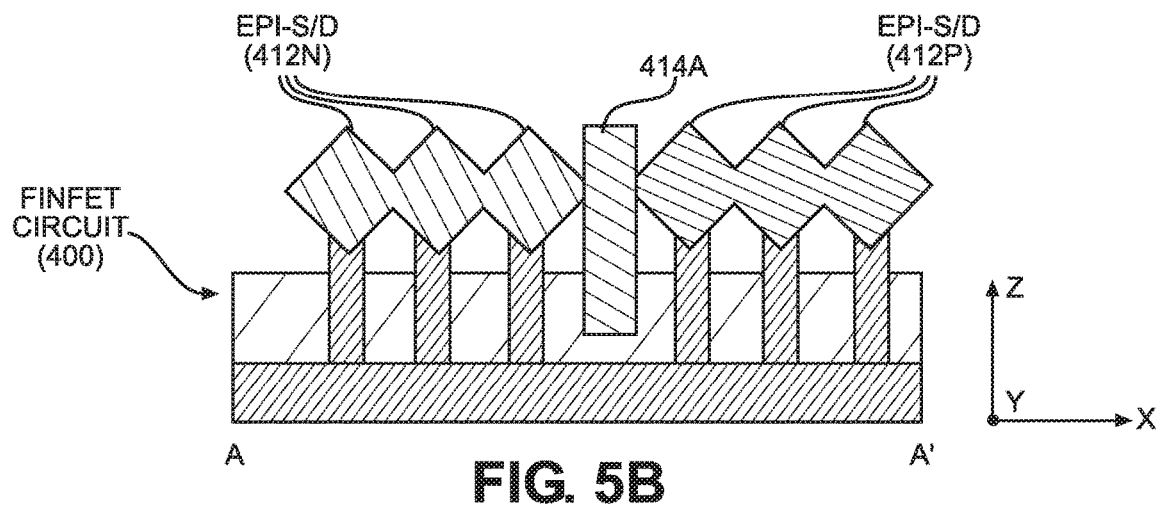
FIG. 5B is a cross-sectional side view of the exemplary complementary cell circuit in FIG. 5A illustrating an isolation wall providing a barrier to growth of epitaxial S/D material in a direction extending above the isolation region.
Figure 5C:
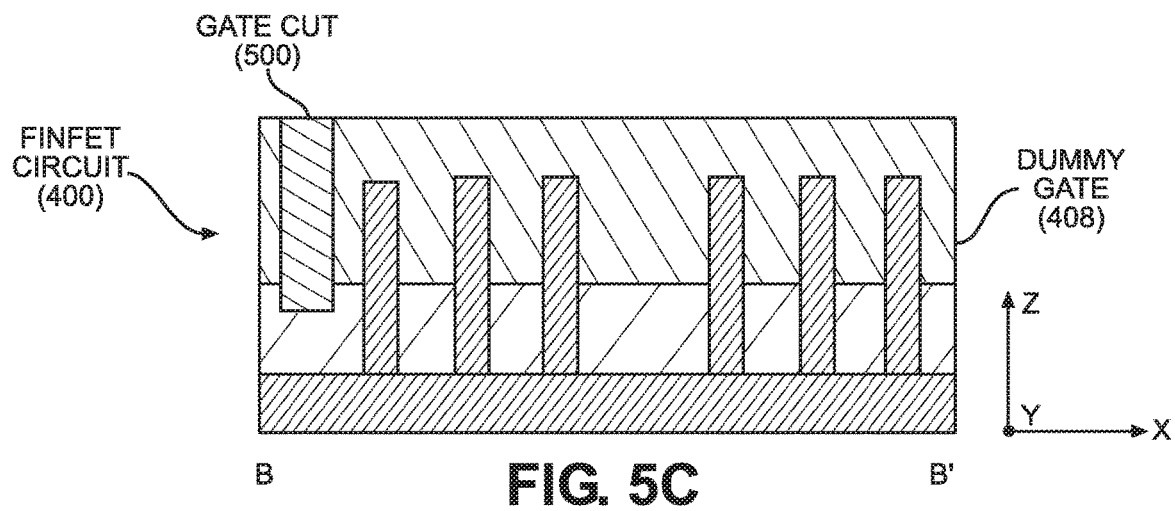
FIG. 5C is a cross-sectional side view of the exemplary complementary cell circuit in FIG. 5A illustrating a gate cut formed at an end of the dummy gate.

FIGS. 5A-5C illustrate another example of the FinFET circuit 400 of FIGS. 4A-4C having a gate cut 500 disposed at an end of the dummy gate 408. FIG. 5A is a top view of the FinFET circuit 400 similar to the view in FIG. 4A, but FIG. 5A shows the gate cut 500 extending across the dummy gate 408. Thus, when the dummy gate 408 is replaced by a conductive gate at a subsequent fabrication stage, the conductive gate on the FinFET circuit 400 will be separate from (i.e., electrically, isolated from) a conductive gate formed on the opposite side of the gate cut 500 where a dummy gate section 502 is shown. Thus, the gate cut 500 will be disposed at an end of the conductive gate. The dummy gate section 502 may extend across an adjacent circuit and be replaced with a conductive gate. As discussed in more detail below, the gate cut 500 may be formed of the same material from which the isolation walls 414A and 414B are formed as part of a common process.

FIG. 5B is a cross-sectional side view at line A-A' of the FinFET circuit 400 in FIG. 5A that illustrates the epi-S/Ds 412P and 412N separated by the isolation wall 414A and does not show the gate cut 500 in the FinFET circuit 400.

FIG. 5C is a cross-sectional side view at line B-B' of the FinFET circuit 400 in FIG. 5A, like FIG. 4C, but including the gate cut 500. The gate cut 500 is disposed at an end of the dummy gate 408, providing a barrier that electrically isolates a conductive gate in the FinFET circuit 400 from an adjacent circuit (not shown).

Figure 6A:
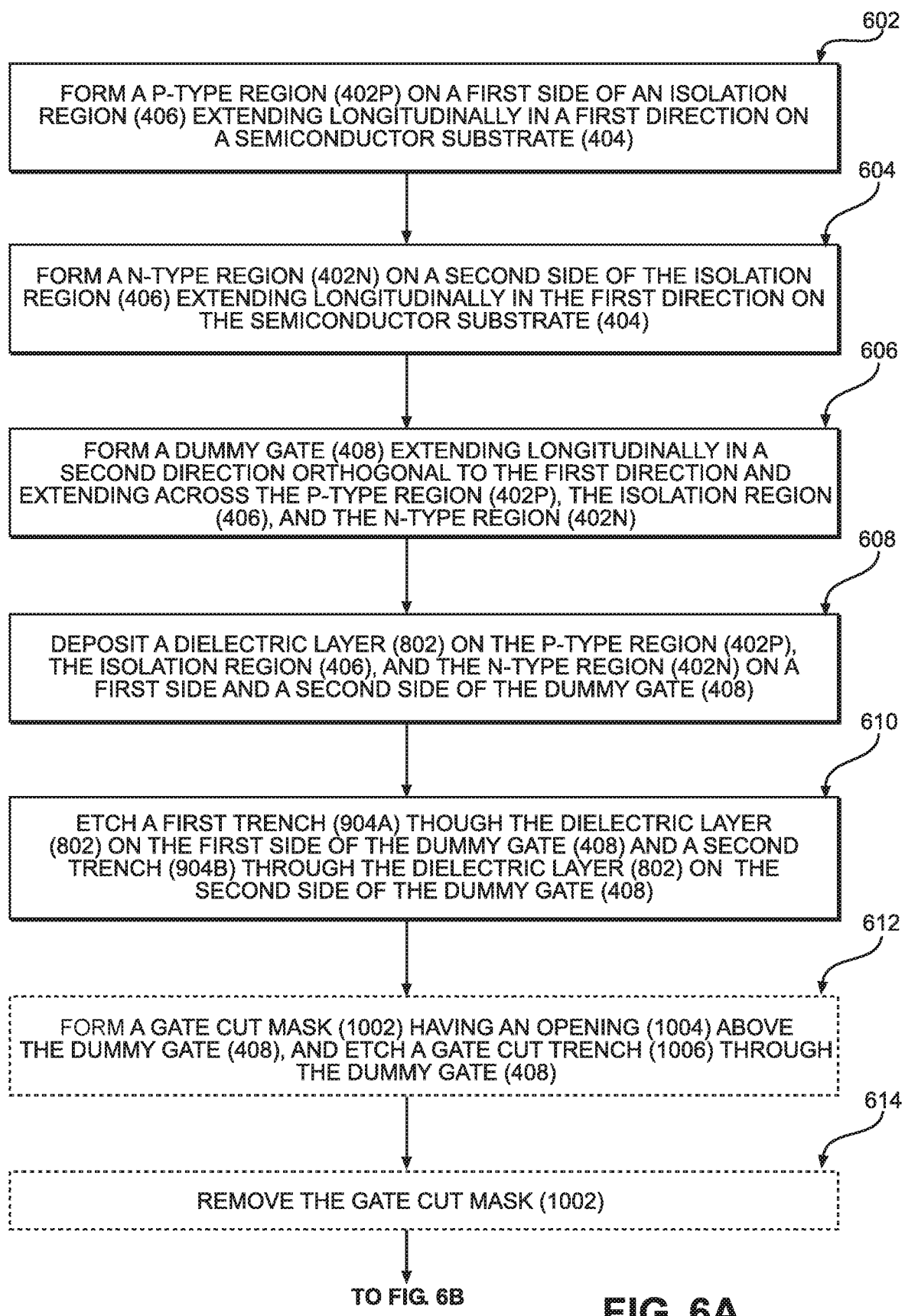
FIGS. 6A and 6B are a flowchart illustrating an exemplary process in a method of fabricating the complementary cell circuit in FIG. 5A including isolation walls formed between a P-type region and an N-type region to prevent short defects resulting from process variations.
Figure 6B:
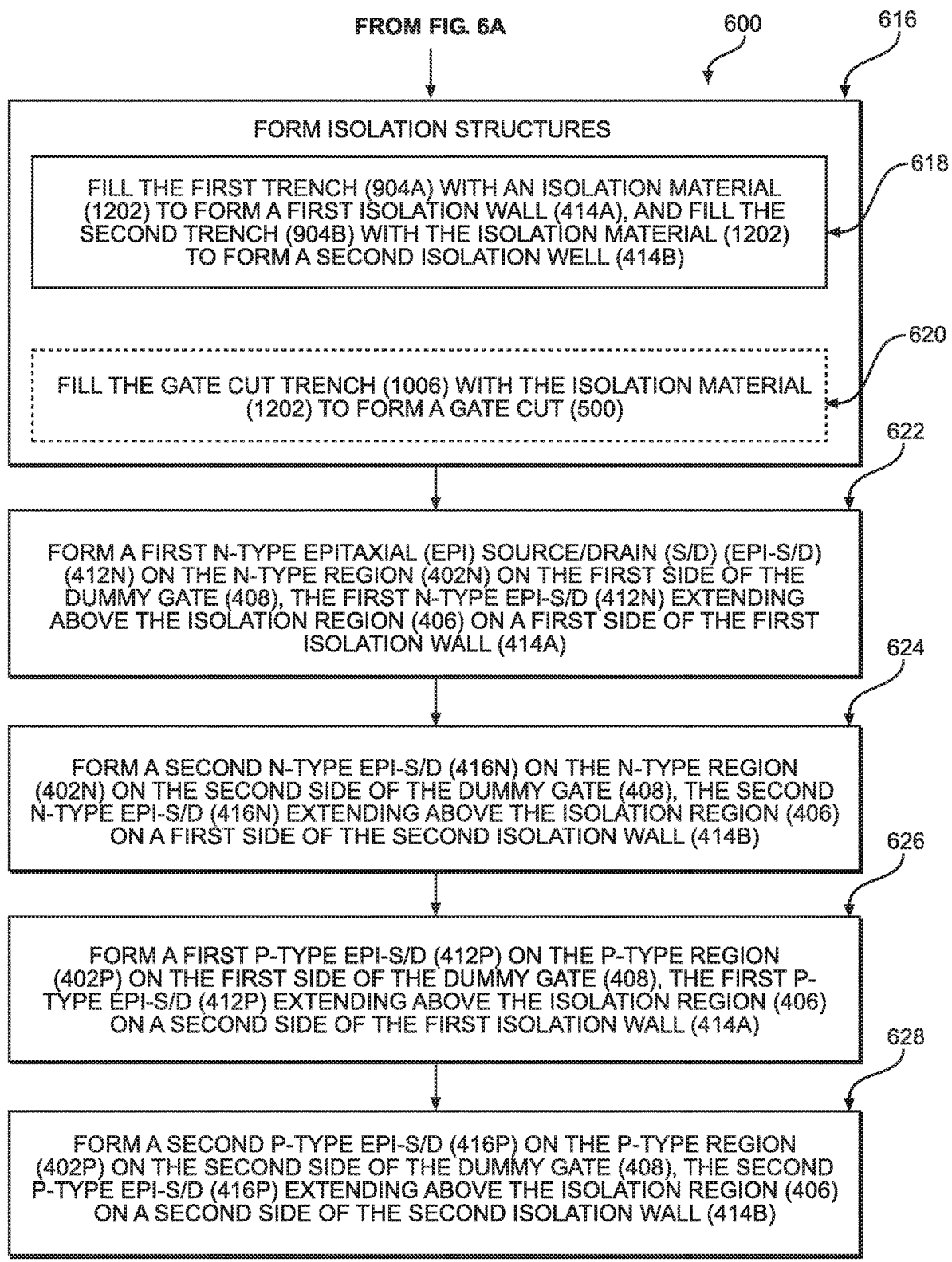

FIGS. 6A and 6B are a flowchart illustrating an exemplary method 600 of forming a complementary cell circuit including isolation structures, such as the FinFET circuit 400 in FIGS. 4A-4C and 5A-5C. The isolation structures in the FinFET circuit 400 include the isolation walls 414A and 414B, and may include the gate cut 500. The method 600 is described with reference to FIGS. 7A-7C through FIGS. 13A-13C.

Figure 7A:
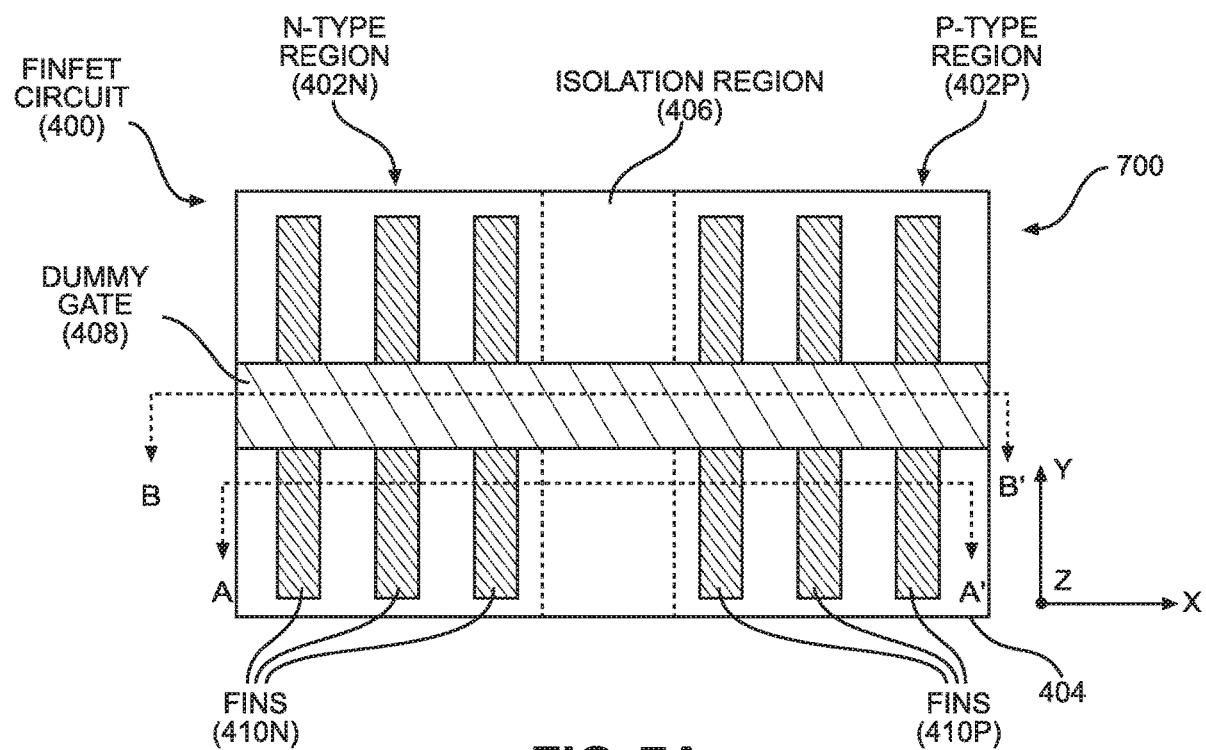
FIG. 7A is a top view of a first fabrication stage of the complementary cell circuit, or FinFET circuit, in FIGS. 4A-4C including fins formed in a P-type region and an N-type region of a substrate and a dummy gate formed across the fins.
Figure 7B:
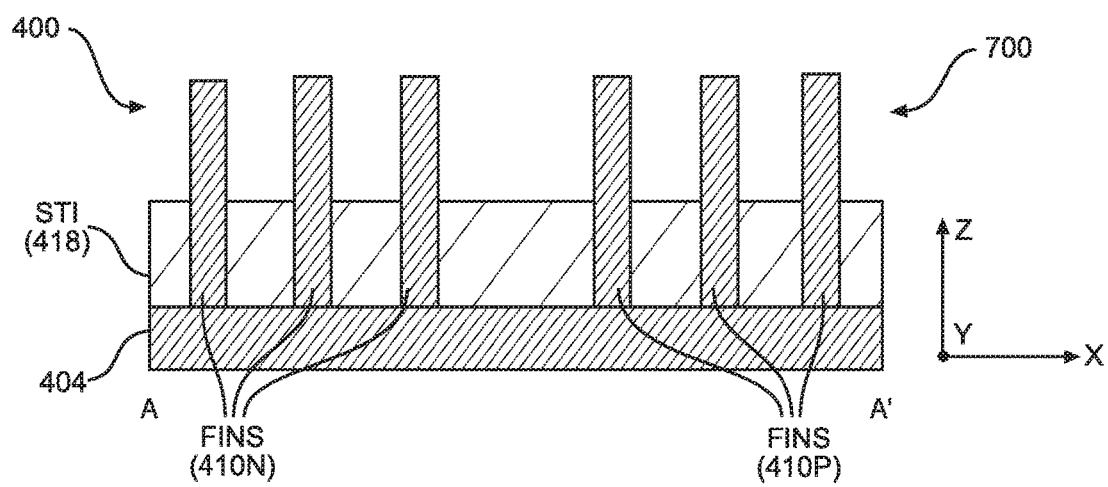
FIG. 7B is a cross-sectional side view of S/D regions of the FinFET circuit in FIG. 7A illustrating fins extending from the substrate in the P-type region and the N-type region.
Figure 7C:
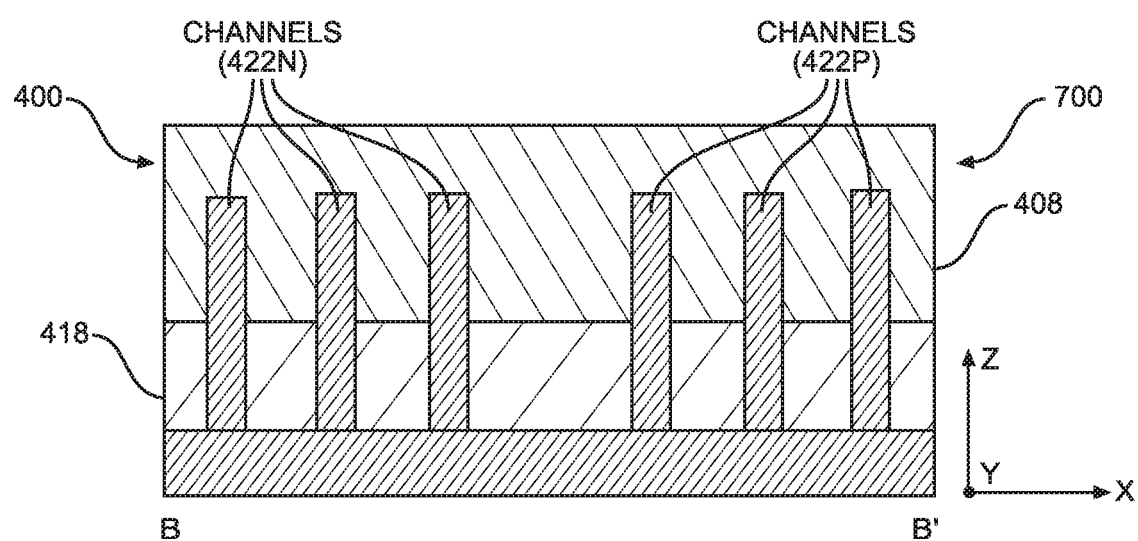
FIG. 7C is a cross-sectional side view through channels of the fins in the FinFET circuit in FIG. 7A illustrating a dummy gate overlapping the fins extending from the substrate in the P-type region and the N-type region.

FIGS. 7A-7C illustrate the FinFET circuit 400 in FIGS. 4A-4C in a first fabrication stage 700. The first fabrication stage 700 includes forming the P-type region 402P on a first side of the isolation region 406 on the semiconductor substrate 404 (block 602 in FIG. 6A). The first fabrication stage 700 further includes forming the N-type region 402N on a second side of the isolation region 406 on the semiconductor substrate 404 (block 604 in FIG. 6A). The first fabrication stage 700 also includes forming a dummy gate 408 extending longitudinally across the P-type region 402P, the isolation region 406, and the N-type region 402N (block 606 in FIG. 6A). In the FinFET circuit 400 in FIG. 7A, the fins 410P and 410N extending in the Y-axis direction are formed in the P-type region 402P and N-type region 402N, respectively, and the dummy gate 408 is formed to extend longitudinally in the X-axis direction.

FIG. 7B is a cross-sectional side view at line A-A' of the FinFET circuit 400 in FIG. 7A illustrating the STI 418 between the fins 410P and 410N and in the isolation region 406. The fins 410N and 410P extend above a top surface of the STI 418. FIG. 7C is a cross-sectional side view at line B-B' of the FinFET circuit 400 in FIG. 7A illustrating the dummy gate 408 formed across the channels 422P and 422N and a portion of the STI 418.

Figure 8A:
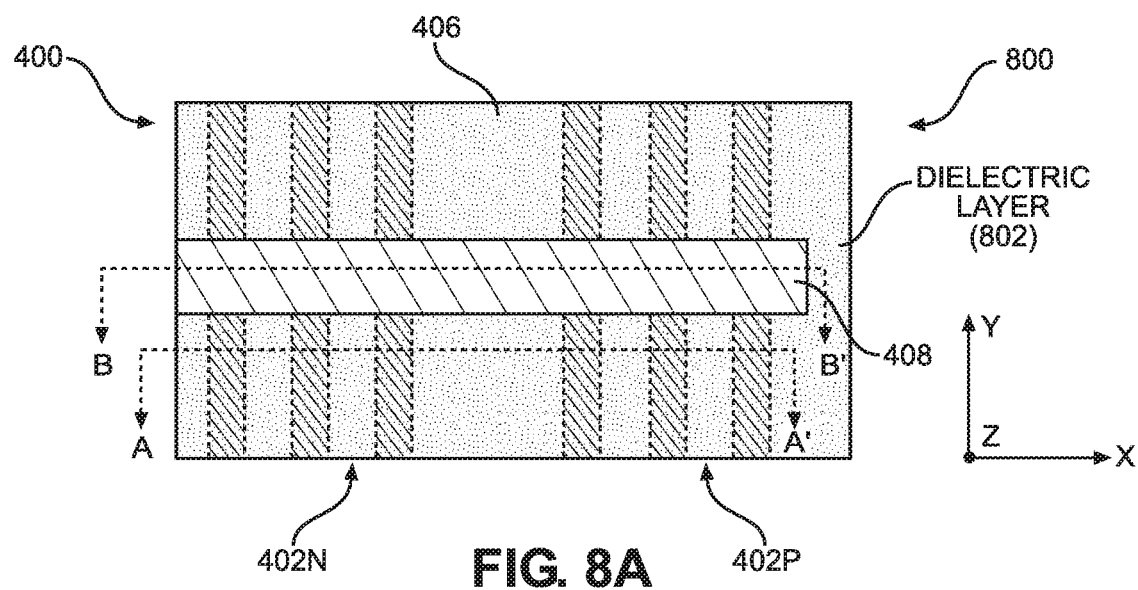
FIG. 8A is a top view of a fabrication stage in which a dielectric layer is deposited on the fins of the FinFET circuit in FIG. 7A to a height of the dummy gate.
Figure 8B:
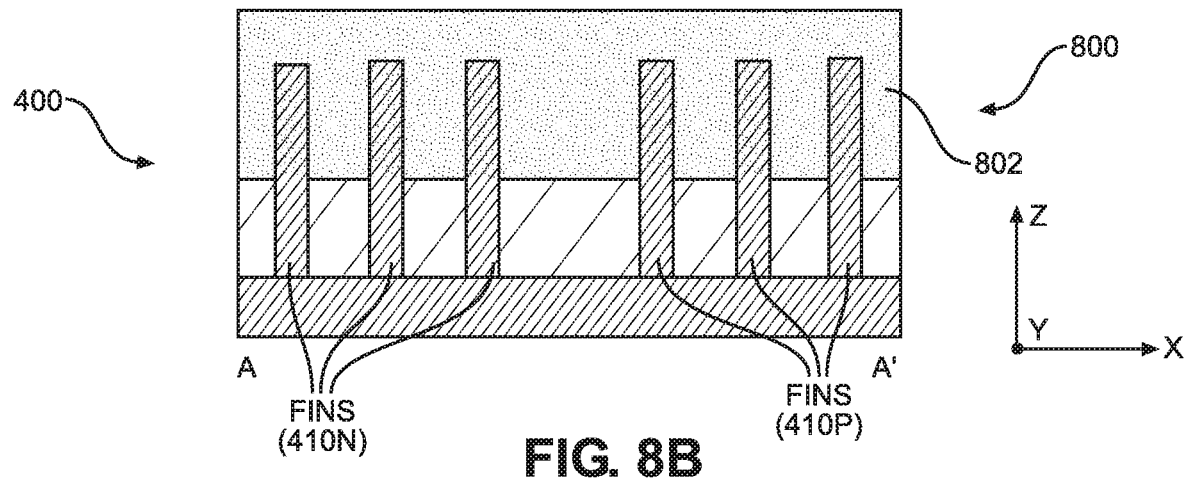
FIG. 8B is a cross-sectional side view of the S/D regions of the FinFET circuit in FIG. 8A illustrating the dielectric layer deposited on the fins on the substrate on a side of the dummy gate.
Figure 8C:
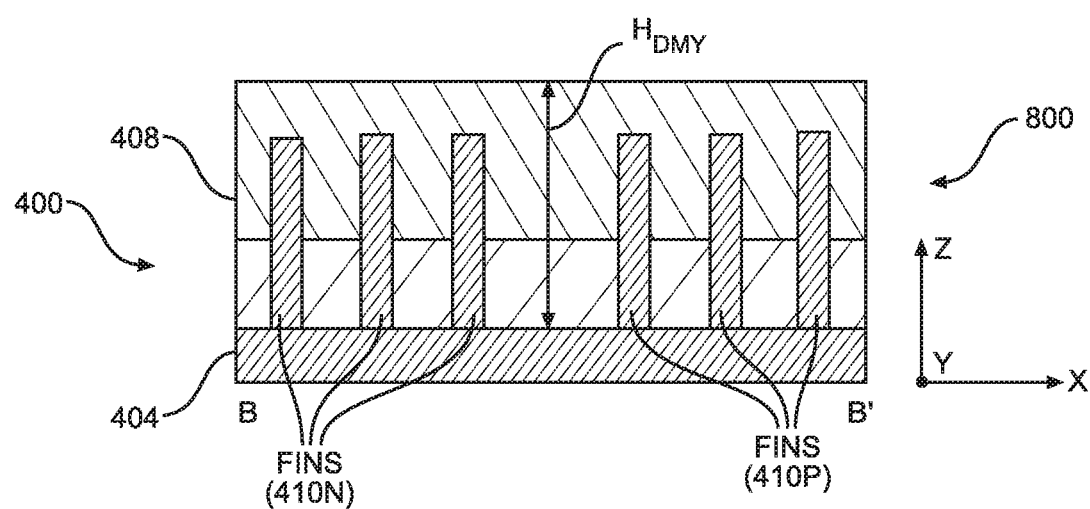
FIG. 8C is a cross-sectional side view through the channels of the fins in the FinFET circuit in FIG. 8A illustrating the dummy gate overlapping the fins extending from the substrate in the P-type region and the N-type region.

FIGS. 8A-8C illustrate the FinFET circuit 400 in a fabrication stage 800. The fabrication stage 800 includes, as shown in FIG. 8A, depositing a dielectric layer 802 on the P-type region 402P, the isolation region 406, and the N-type region 402N on a first side and a second side of the dummy gate 408 (block 608 in FIG. 6A). In a photolithographic process, the dielectric layer 802 is deposited on the fins 410N and 410P, the dummy gate 408, and the STI 418 to protect these structures of the FinFET circuit 400. In subsequent fabrication stages, the dielectric layer 802 provides a medium in which the isolation walls 414A and 414B are formed.

FIGS. 8B and 8C are cross-sectional side views at lines A-A' and B-B', respectively, of the FinFET circuit 400 in FIG. 8A. The dielectric layer 802 may be planarized to a height $H_{DMY}$ of the dummy gate 408 above the semiconductor substrate 404, which is higher than the fins 410P and 410N.

Figure 9A:
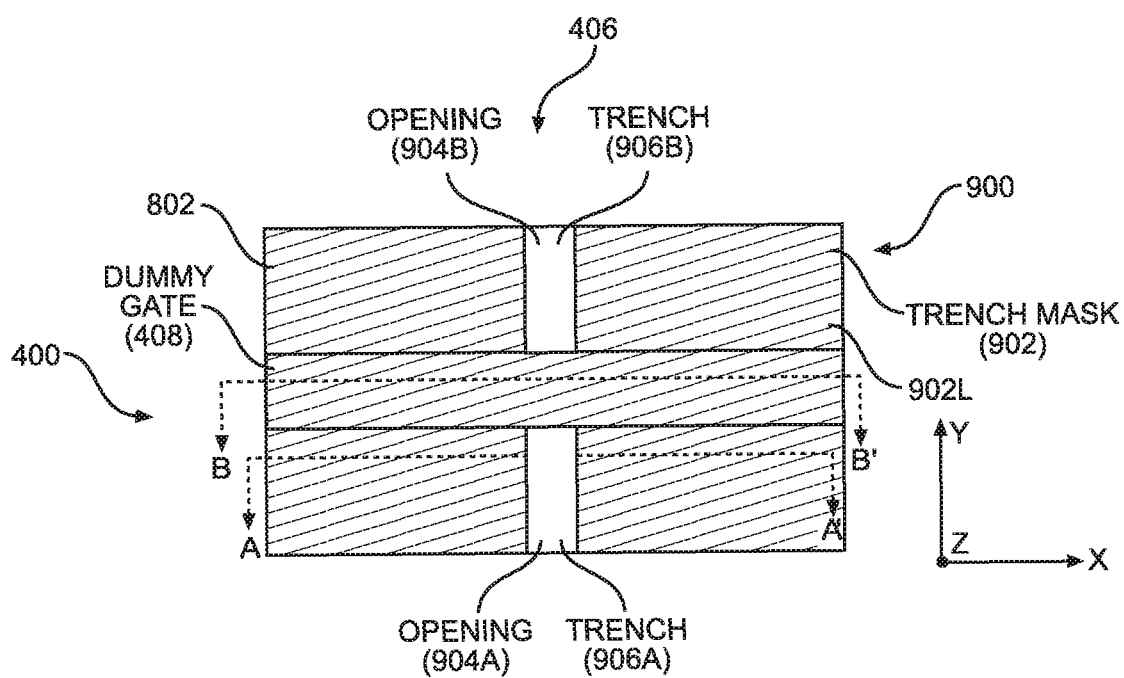
FIG. 9A is a top view of a fabrication stage in which a first patterned mask is formed on the FinFET circuit in FIG. 8A, and voids are etched in the dielectric layer according to the first patterned mask.
Figure 9B:
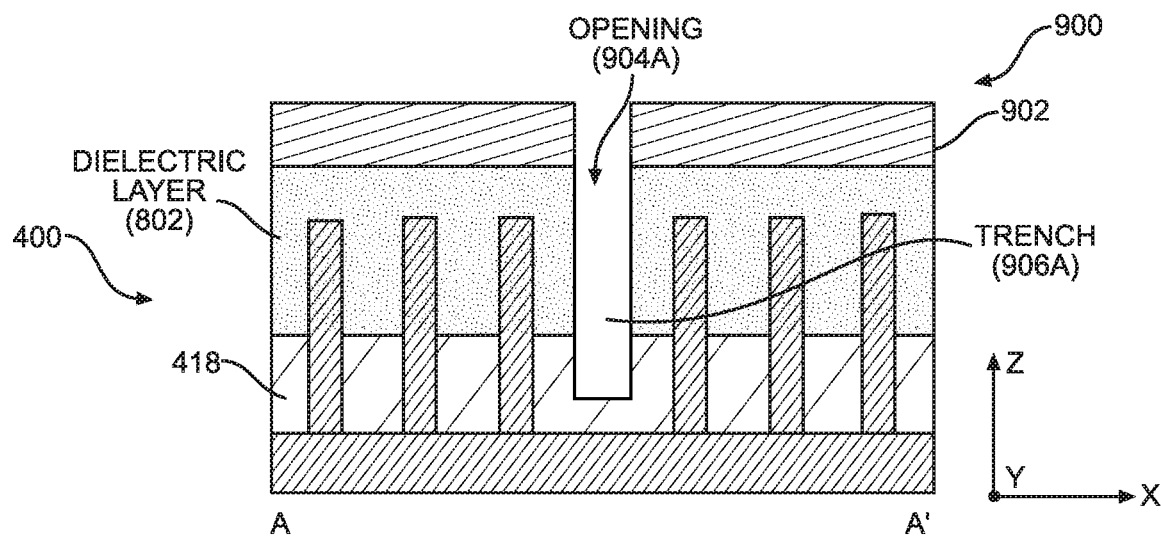
FIG. 9B is a cross-sectional side view of the S/D regions of the FinFET circuit in FIG. 9A illustrating the first patterned mask on the dielectric layer and a void etched in the dielectric layer in the isolation region according to the first patterned mask.
Figure 9C:
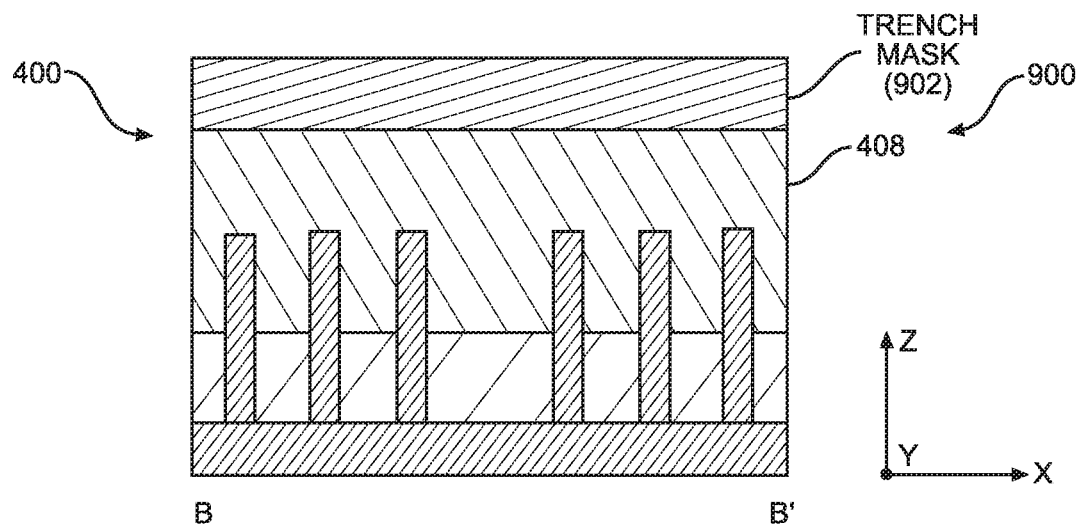
FIG. 9C is a cross-sectional side view through the channels of the fins in the FinFET circuit in FIG. 9A illustrating the first patterned mask on the dummy gate.

FIGS. 9A-9C illustrate the FinFET circuit 400 in a fabrication stage 900. The fabrication stage 900 includes forming a trench mask 902 on the dielectric layer 802 and the dummy gate 408. FIG. 9A is a top view of the FinFET circuit 400 in FIG. 8A showing the trench mask 902 deposited on the dielectric layer 802 and the dummy gate 408. The trench mask 902 is a patterned layer formed of a material that is not vulnerable to the etching process. The trench mask 902 is employed to protect areas that are not to be etched and expose areas that are to be etched. Forming the trench mask 902 includes depositing a trench mask layer 902L and patterning the trench mask layer 902L to create openings 904A and 904B for forming trenches 906A and 906B in the dielectric layer 802. The openings 904A and 904B expose the areas of the FinFET circuit 400 in which the trenches 906A and 906B are formed. FIG. 9A shows the trench mask 902 patterned above the isolation region 406 to create the openings 904A and 904B below which the trenches 906A and 906B are etched into the dielectric layer 802.

The fabrication stage 900 also includes etching the trench 906A through the dielectric layer 802 on the first side of the dummy gate 408 and etching the trench 906B through the dielectric layer 802 on the second side of the dummy gate 408 (block 610 in FIG. 6A). FIG. 9B is a cross-sectional side view at line A-A' of the FinFET circuit 400 in FIG. 9A illustrating the trench 906A etched in the dielectric layer 802. The trenches 906A and 906B extend into the surface of the isolation region 406. Thus, etching the trench 906A includes etching into the surface of the isolation region 406 on the first side of the dummy gate 408, and etching the trench 906B includes etching into the surface of the isolation region on the second side of the dummy gate 408. FIG. 9B shows that the trench 906A is etched through the dielectric layer 802 and into the STI 418 in the isolation region 406 below the opening 904A in the trench mask 902. Thus, the trench 906A extends in the Z-axis direction into the isolation region 406, which includes the STI 418, Etching the trenches 906A and 906B into the dielectric layer 802 and the STI 418 provides a mold or hollow defining the shape/size of the isolation walls 414A and 414B to be formed. In addition, after the isolation walls 414A and 414B are formed and the dielectric layer 802 is removed, the portions of the trenches 906A and 906B in the STI 418 provide support for the isolation walls 414A and 414B through subsequent processing. FIG. 9C is a cross-sectional side view at line B-B' of the FinFET circuit 400 in FIG. 9A. FIG. 9C illustrates that the trench mask 902 is formed above the dummy gate 408 to protect the dummy gate during the etching process forming the trenches 906A and 906B. This portion of the trench mask 902 differs from the mask for forming the gate cut 500 in FIGS. 10A-10C.

Figure 10A:
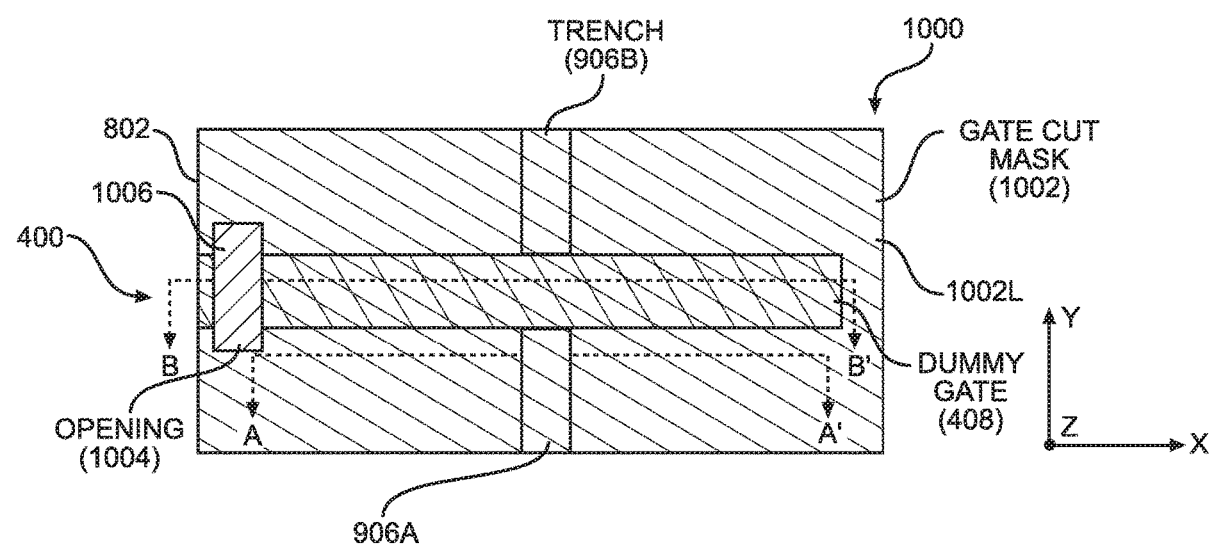
FIG. 10A is a top view of a fabrication stage in which a second patterned mask is deposited on the FinFET circuit in FIG. 9A and a void is etched in the dummy gate according to the second patterned mask.
Figure 10B:
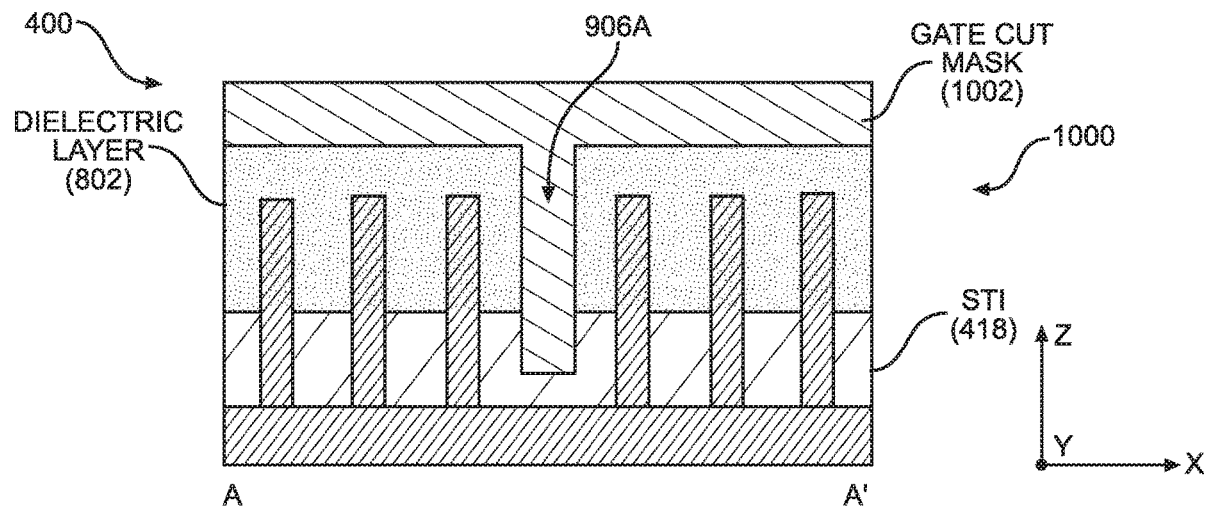
FIG. 10B is a cross-sectional side view of the S/D regions of the FinFET circuit in FIG. 10A illustrating the second patterned mask deposited on the dielectric layer and in the void etched in the dielectric layer.
Figure 10C:
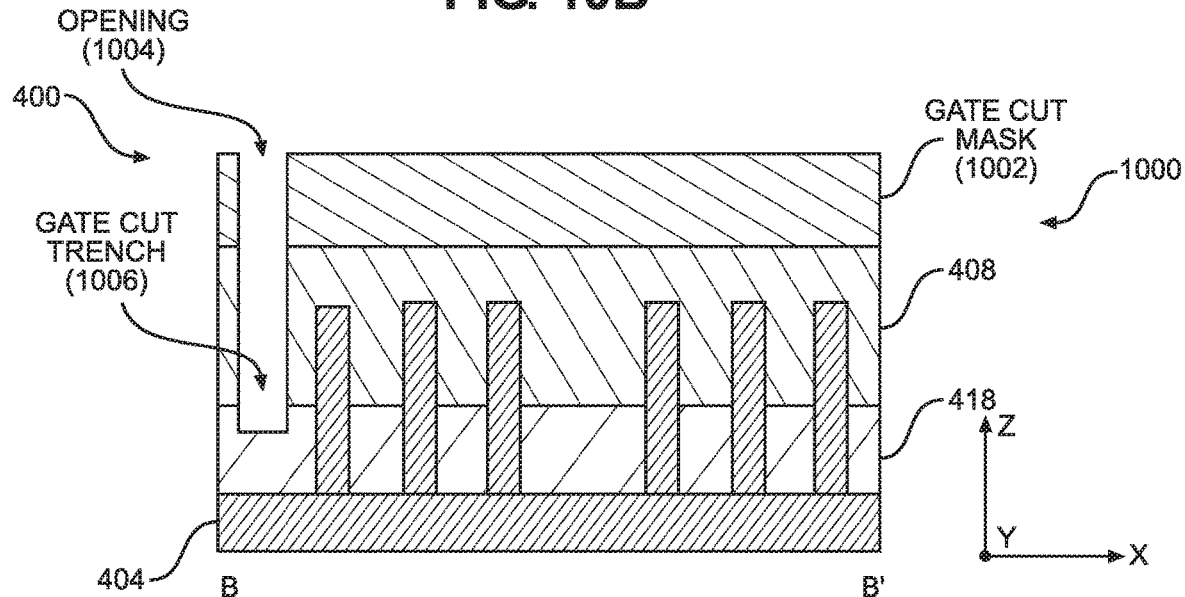
FIG. 10C is a cross-sectional side view through a channel of the FinFET circuit in FIG. 10A illustrating the second patterned mask deposited on the dummy gate and the void etched in the dummy gate according to the second patterned mask.

FIGS. 10A-10C illustrate the FinFET circuit 400 in an optional fabrication stage 1000. The fabrication stage 1000 is an optional fabrication stage employed in fabricating the FinFET circuit 400 to include the gate cut mask 500. The fabrication stage 1000 includes removing the trench mask 902 from the FinFET circuit 400 in FIG. 9A. The fabrication stage 1000 includes optional steps for forming a gate cut 500 as shown in the example in FIGS. 5A and 5C. Fabrication stage 1000 includes forming a gate cut mask 1002 having an opening 1004 above the dummy gate 408. FIG. 10A is a top view of the FinFET circuit 400 in FIG. 9A showing the gate cut mask 1002 formed above the dielectric layer 802 and the dummy gate 408. FIG. 10A shows the opening 1004 above the dummy gate 408 and extending onto the dielectric layer 802 on each side of the dummy gate 408, In this regard, forming the gate cut mask 1002 includes depositing a gate cut mask layer 1002L on the dielectric layer 802 and the dummy gate 408, and into the trenches 906A and 906B.

FIG. 10B is a cross-sectional side view at line A-A' of the FinFET circuit 400 in FIG. 10A illustrating the gate cut mask 1002 on the dielectric layer 802 and in the trench 906A. Forming the gate cut mask 1002 includes patterning the gate cut mask 1002 to create the opening 1004 above the dummy gate 408 for forming the gate cut trench 1006 in the dummy gate 408. The dummy gate 408 beneath the gate cut mask 1002 is exposed to the etching process, which is controlled by, for example, time and concentration to remove material of the dummy gate 408 and some material of the STI 418 below the opening 1004. The fabrication stage 1000 includes etching the gate cut mask 1002 having the opening 1004 above the dummy gate 408, and etching the gate cut trench 1006 through the dummy gate 408 (block 612 in FIG. 6A). FIG. 10C is a cross-sectional side view at line B-B' of the FinFET circuit 400 in FIG. 10A illustrating the gate cut trench 1006 etched through the dummy gate 408 below the opening 1004. FIG. 10C shows that the gate cut trench 1006 extends into the STI 418 but may not extend fully through the STI 418 to the semiconductor substrate 404.

Figure 11A:
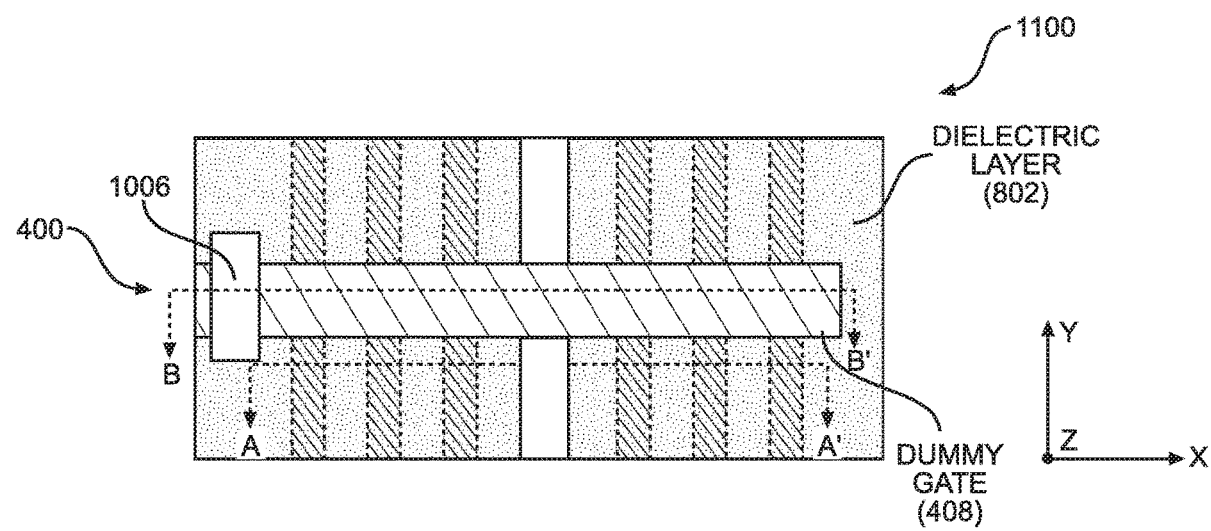
FIG. 11A is a top view of a fabrication stage in which the second patterned mask is removed from the FinFET circuit in FIG. 10A.
Figure 11B:
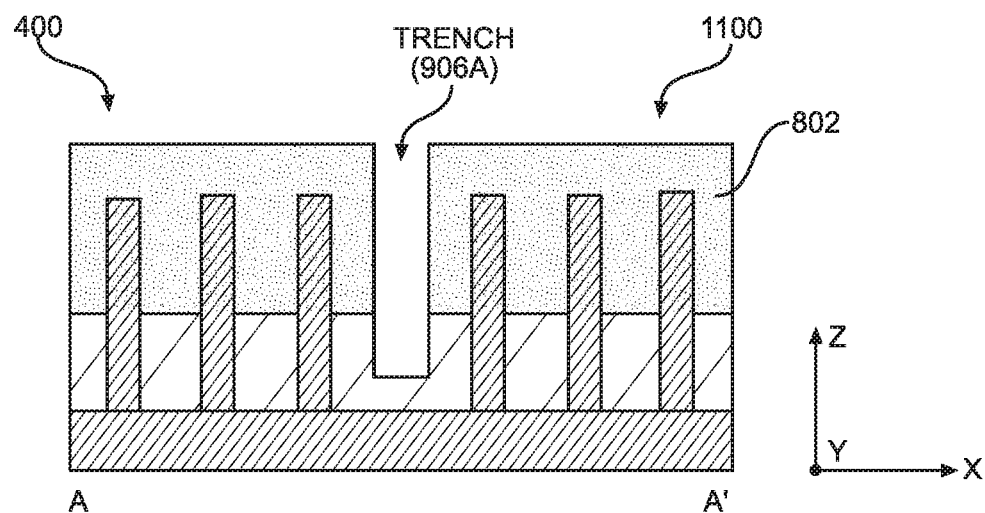
FIG. 11B is a cross-sectional side view of the S/D regions of the FinFET circuit in FIG. 11A illustrating the second patterned mask removed from the dielectric layer and from the void etched in the dielectric layer in the isolation region.
Figure 11C:
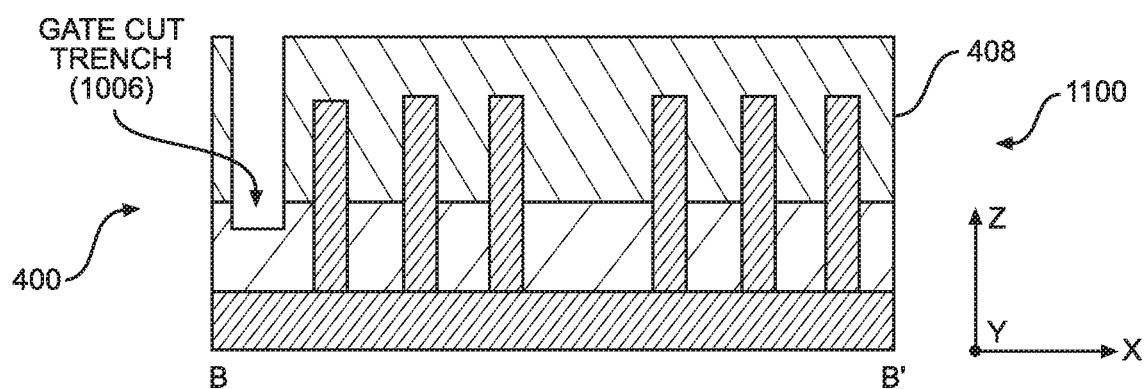
FIG. 11C is a cross-sectional side view through the channels of the fins in the FinFET circuit in FIG. 11A illustrating the second patterned mask removed from the dummy gate.

FIGS. 11A-11C illustrate the FinFET circuit 400 in an optional fabrication stage 1100 employed for fabricating the gate cut 500. The fabrication stage 1100 includes removing the gate cut mask 1002 (block 614 in FIG. 6A), which was deposited in fabrication stage 1000. FIG. 11A is a top view of the FinFET circuit 400 in FIG. 10A with the gate cut mask 1002 removed. FIG. 11B is a cross-sectional side view at line A-A' of the FinFET circuit 400 in FIG. 11A showing that the gate cut mask 1002 has been removed from the dielectric layer 802, and from the trench 906A. FIG. 11C is a cross-sectional side view at line B-B' of the FinFET circuit 400 in FIG. 11A showing the gate cut mask 1002 removed from the dummy gate 408, and the gate cut trench 1006 that was formed in fabrication stage 1000.

Figure 12A:
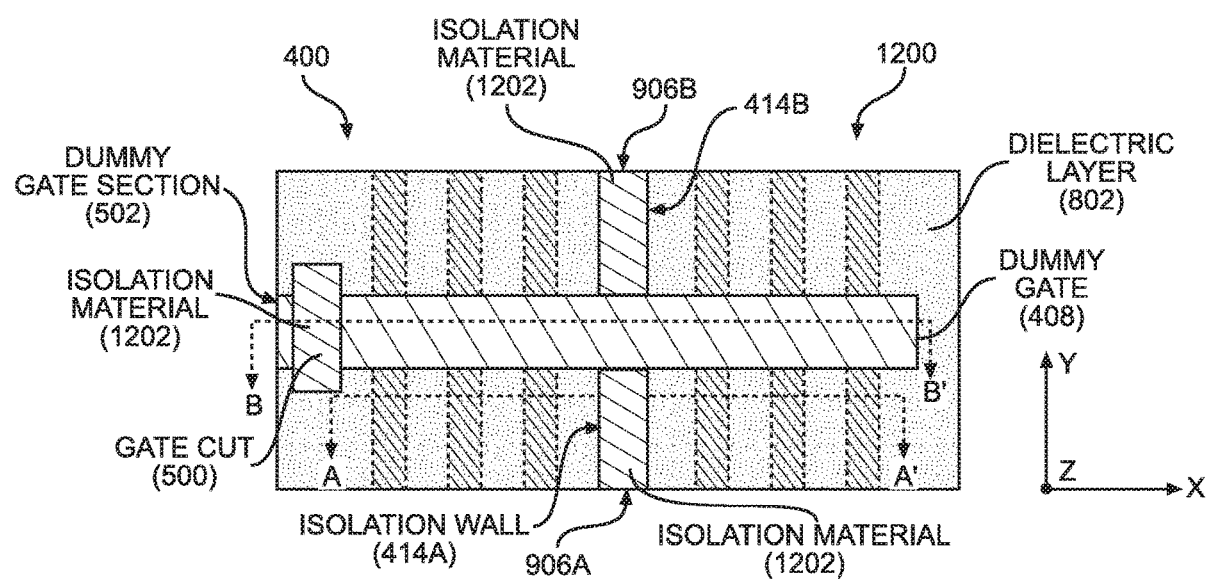
FIG. 12A is a top view of a fabrication stage in which the voids in the dielectric layer and the dummy gate of the FinFET circuit in FIG. 11A have been filled to form isolation structures including isolation walls and a gate cut.
Figure 12B:
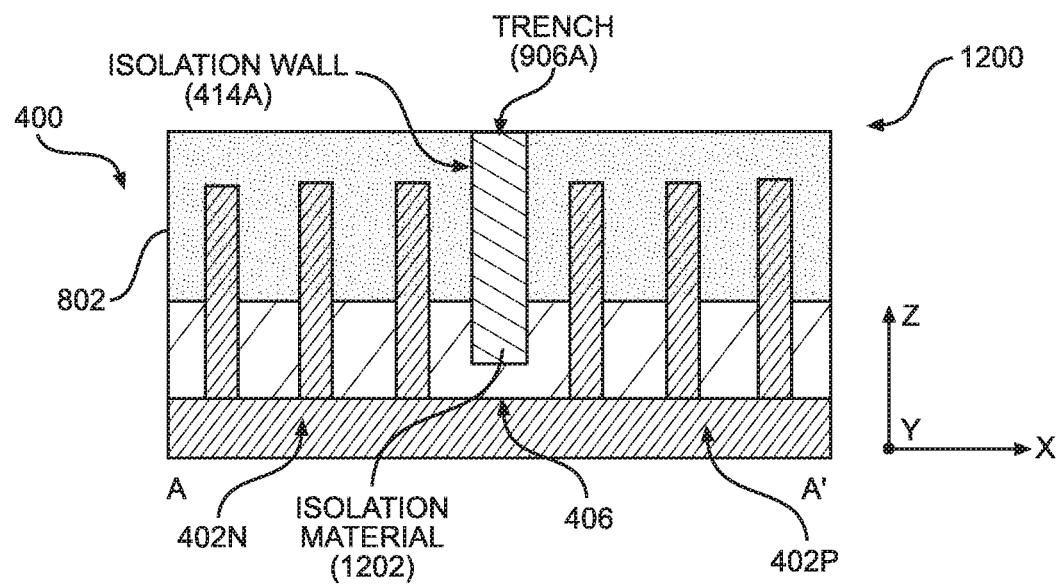
FIG. 12B is a cross-sectional side view of the S/D regions of the FinFET circuit in FIG. 12A illustrating the isolation walls formed in the void etched in the dielectric layer in the isolation region.
Figure 12C:
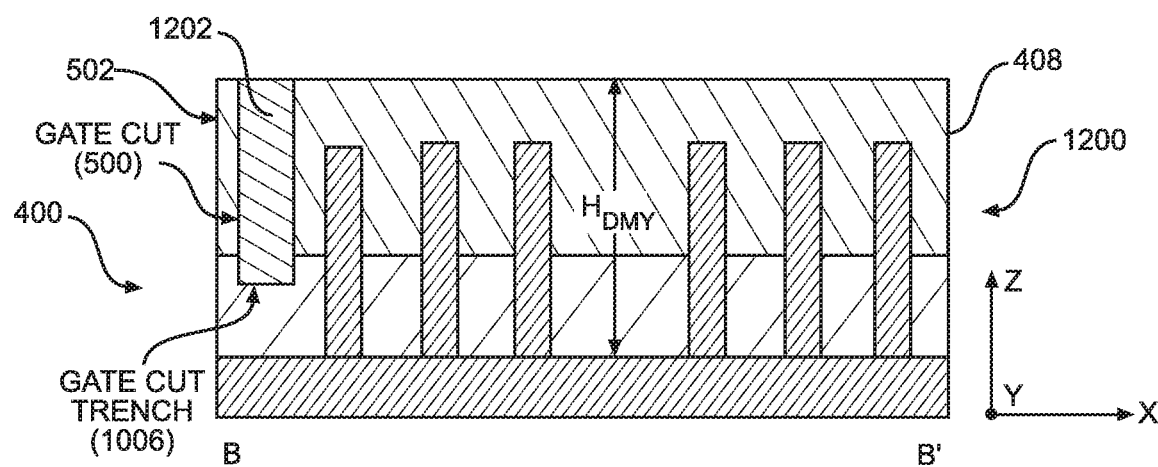
FIG. 12C is a cross-sectional side view through the channels of the fins in the FinFET circuit in FIG. 12A illustrating the gate cut formed in the void etched in the dummy gate.

FIGS. 12A-12C illustrate the FinFET circuit 400 in a fabrication stage 1200. The fabrication stage 1200 includes forming isolation structures (block 616 in FIG. 6B). Forming the isolation structures includes filling the trench 906A with isolation material 1202 to form the isolation wall 414A and filling the trench 906B with the isolation material 1202 to form the isolation wall 414B (block 618 in FIG. 6B). FIG. 12A is a top view of the FinFET circuit 400 in FIG. 11A with the trenches 906A and 906B and the gate cut trench 1006 filled with the isolation material 1202. The trenches 906A and 906B are filled to the top of the dielectric layer 802.

Since the dielectric layer 802 is planarized to the height $H_{DMY}$ of the dummy gate 408 (see FIG. 12C), filling the trenches 906A and 906B includes filling the trench 906A and trench 906B with the isolation material 1202 to a height $H_{DMY}$ of the dummy gate. FIG. 12B is a cross-sectional side view at line A-A' of the FinFET circuit 400 in FIG. 12A showing the isolation material 1202 in the trench 906A to form the isolation wall 414A between the P-type region 402P and the N-type region 402N to limit growth of epitaxial material horizontally above the isolation region 406.

In addition, if the optional steps for creating the gate cut 500 are performed, depositing the isolation material 1202 further includes filling the gate cut trench 1006 with the isolation material 1202 to the height $H_{DMY}$ of the dummy gate 408 to form the gate cut 500 (block 620 in FIG. 6B). The isolation material 1202 may include at least one of SiN, SiON, SiC, and AlO or other insulating material. FIG. 12C is a cross-sectional side view at line B-B' of the FinFET circuit 400 in FIG. 12A showing the gate cut trench 1006 filled with the isolation material 1202 to form the gate cut 500 to electrically isolate a conductive gate (not shown) that replaces the dummy gate section 502 of the dummy gate 408 in an adjacent circuit.

Figure 13A:
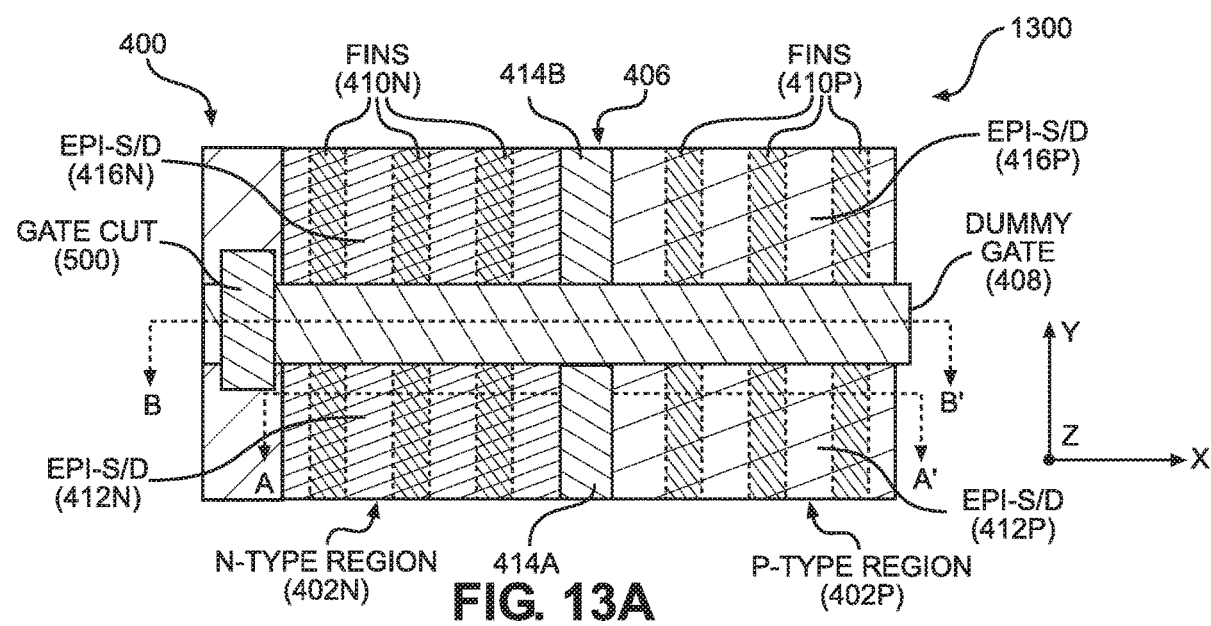
FIG. 13A is a top view of a fabrication stage in which the dielectric layer of the FinFET circuit in FIG. 12A has been removed and epitaxial material is formed on the fins in the P-type region and the N-type region.
Figure 13B:
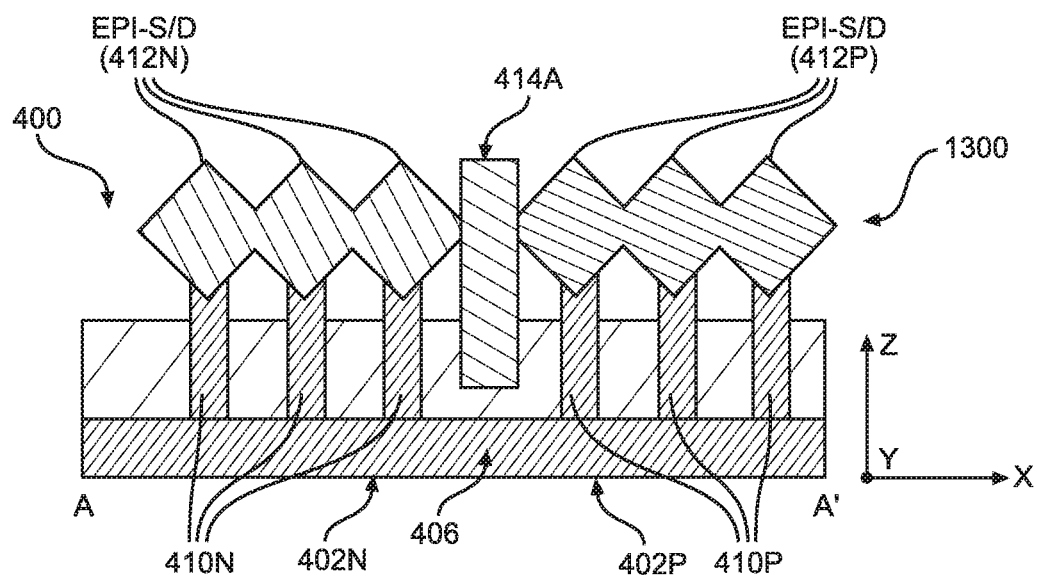
FIG. 13B is a cross-sectional side view of the S/D regions of the FinFET circuit in FIG. 13A illustrating the isolation walls which prevent short defects between the epitaxial material formed on the P-type region and the epitaxial material firmed on the N-type region.
Figure 13C:
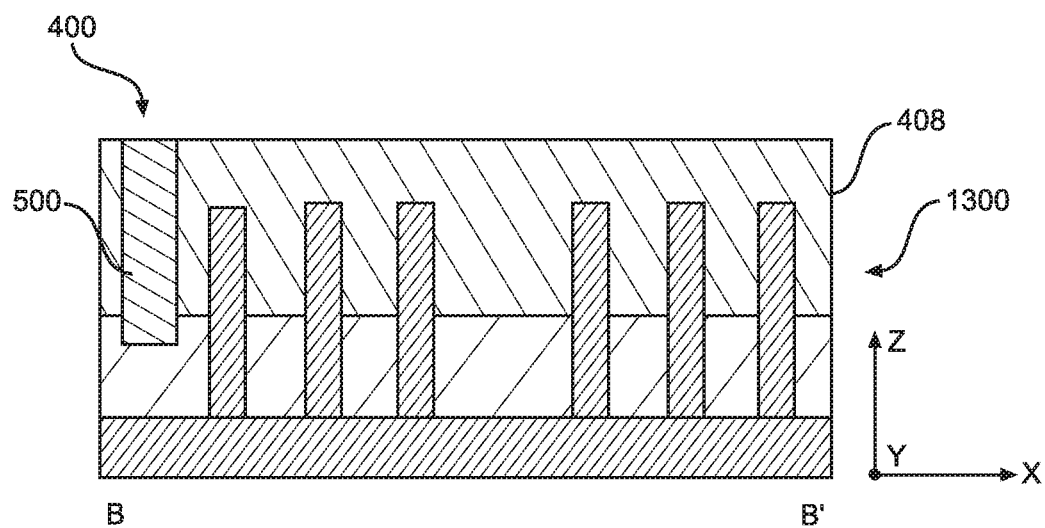
FIG. 13C is a cross-sectional side view through the channels of the fins in the FinFET circuit in FIG. 13A illustrating the gate cut formed in the void etched in the dummy gate.

FIGS. 13A-13C illustrate the FinFET circuit 400 in a fabrication stage 1300. The fabrication stage 1300 includes forming the N-type epi-S/D 412N on the N-type region 402N on the first side of the dummy gate 408 such that the first N-type epi-S/D 412N extends above the isolation region 406 on a first side of the first isolation wall 414A (block 622 in FIG. 6B). The fabrication stage 1300 includes forming a second N-type epi-S/D 416N on the N-type region 402N on the second side of the dummy gate 408, the second N-type epi-S/D 416N extending above the isolation region 406 on a first side of the second isolation wall 414B (block 624 in FIG. 6B). The fabrication stage 1300 includes forming a first P-type epi-S/D 412P on the P-type region 402P on the first side of the dummy gate 408, the first P-type epi-S/D 412P extending above the isolation region 406 on a second side of the first isolation wall 414A and isolated from the first N-type epi-S/D 412N by the first isolation wall 414A (block 626 in FIG. 6B). The fabrication stage 1300 includes forming a second P-type epi-S/D 416P on the P-type region 402P on the second side of the dummy gate 408, the second P-type epi-S/D 416P extending above the isolation wall 414B on a second side of the second isolation wall 414B and isolated from the second N-type epi-S/D 416N by the second isolation wall 414B (block 628 in FIG. 6B).

FIGS. 13A-13C correspond to FIGS. 5A-5C illustrating the FinFET circuit 400 including the gate cut 500. FIG. 13A is a top view of the FinFET circuit 400 in FIG. 12A with the epi-S/Ds 412N and 416N formed on the fins 410N in the N-type region 402N and epi-S/Ds 412P and 416P formed on the fins 410P in the P-type region 402P. FIG. 13B is a cross-sectional side view at line A-A' of the FinFET circuit 400 in FIG. 13A showing that growth of the epi-S/Ds 412P and 412N in a horizontal direction above the isolation region 406 is limited by the isolation wall 414A. In this manner, creation of short defects due to process variations is prevented. FIG. 13C is a cross-sectional side view at line B-B' of the FinFET circuit 400 in FIG. 13A showing the gate cut 500 disposed at an end of the dummy gate 408.

Figure 14A:
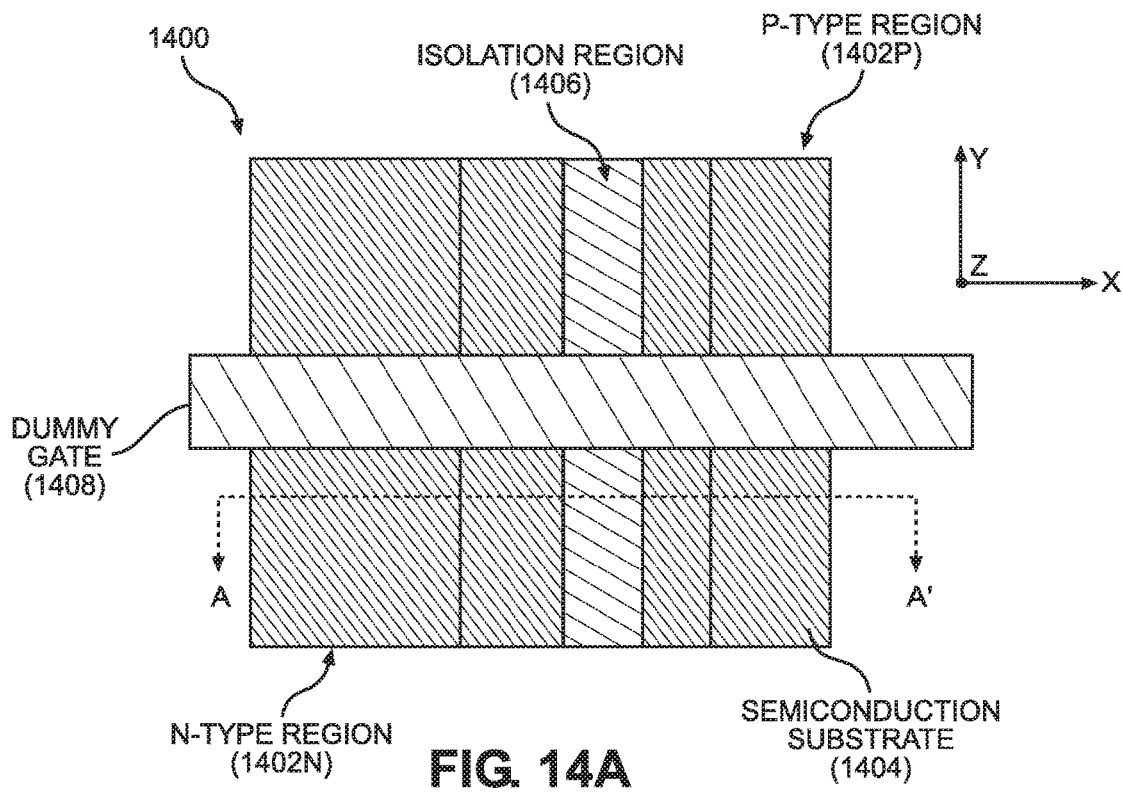
FIG. 14I is a top view of another exemplary complementary cell circuit that is a GAA circuit in which isolation walls are formed on each side of a dummy gate to prevent formation of short defects between epitaxial material in the P-type region and epitaxial material in the N-type region.
FIG. 14B is a cross-sectional side view of epitaxial (epi) S/D (epi-S/D) regions of the GAA circuit in FIG. 14A illustrating isolation walls providing a barrier to prevent formation of short defects between the epitaxial material formed on the P-type region and the epitaxial material formed on the N-type region.

FIG. 14A is a top view of an exemplary GAA circuit 1400, which is another example of a complementary cell circuit as disclosed herein. In FIG. 14A, the GAA circuit 1400 includes a P-type region 1402P and an N-type region 1402N of a semiconductor substrate 1404. The P-type region 1402P and the N-type region 1402N each extend in a Y-axis direction on opposite sides of an isolation region 1406. The GAA circuit 1400 also includes a dummy gate 1408 extending longitudinally in the X-axis direction.

Figure 14B:
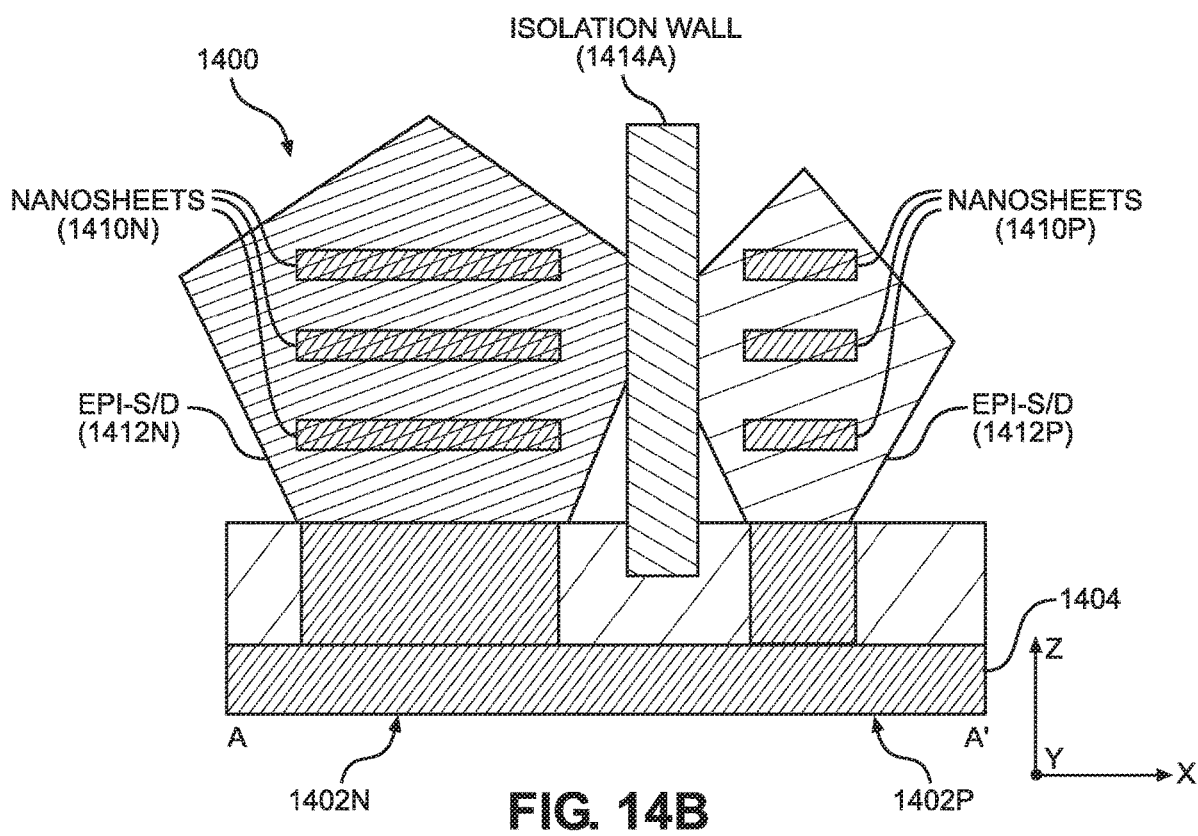

FIG. 14B is a cross-sectional side view at line A-A' of the GAA circuit 1400 in FIG. 14A. The N-type region 1402N includes nanosheets 1410N with an epi-S/D 1412N formed on and around the nanosheets 1410N. The P-type region 1402P includes nanosheets 1410P with an epi-S/D 1412P formed on and around the nanosheets 1410P. In another example of a GAA circuit according to the present disclosure, the nanosheets 1410P and 1410N could alternatively be nanoslabs, nanowires, or other GAA structures, as known in the art. FIG. 14B shows that an isolation wall 1414A is formed between the P-type region 1402P and the N-type region 1402N to limit growth of the epi-S/D 1412N in a horizontal direction above the isolation region 1406, and limit growth of the epi-S/D 1412P in a horizontal direction above the isolation region 1406. In this manner, short defects may be prevented in the GAA circuit 1400.

In the GAA circuit 1400, the N-type epi-S/D 1412N is formed on at least one N-type GAA structure extending longitudinally in the Y-axis direction, and the P-type epi-S/D 1412P is formed on at least one P-type GAA structure extending longitudinally in the Y-axis direction. The N-type GAA structures and the P-type GAA structures are the nanosheets 1410N and 1410P, respectively, as shown in FIG. 14B, but may also be other GAA structures (e.g., nanoslabs, nanowires, etc.). Thus, forming the P-type region 1402P in FIGS. 14A and 14B includes forming at least one P-type GAA structure extending longitudinally in a direction substantially parallel to the semiconductor substrate 1404, and forming the N-type region 1402N includes forming at least one N-type GAA structure extending longitudinally in a direction substantially parallel to the semiconductor substrate 1404.

In another example, a complementary cell circuit (not shown) employing planar transistors can be fabricated without short defects between P-type and N-type regions by including an isolation wall in an isolation region. In such complementary cell circuit, a planar N-type transistor comprises a first N-type epi-S/D and a second N-type epi-S/D, and a planar P-type transistor comprises a first P-type epi-S/D and a second P-type epi-S/D. In the fabrication of such complementary cell circuit, forming a P-type region further comprises forming a P-type planar region on a semiconductor substrate, and forming an N-type region further comprises forming an N-type planar region on the substrate.

A complementary cell circuit including isolation walls formed between an N-type region and a P-type region to limit growth of P-type epi-S/Ds and N-type epi-S/Ds in a horizontal direction above an isolation region between the N-type region and the P-type region to prevent short defects resulting from process variations in a process for forming epitaxial layers, as illustrated in any of FIGS. 4A-4C, 5A-5C, 13A-13C, and 14A-14B according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 15:
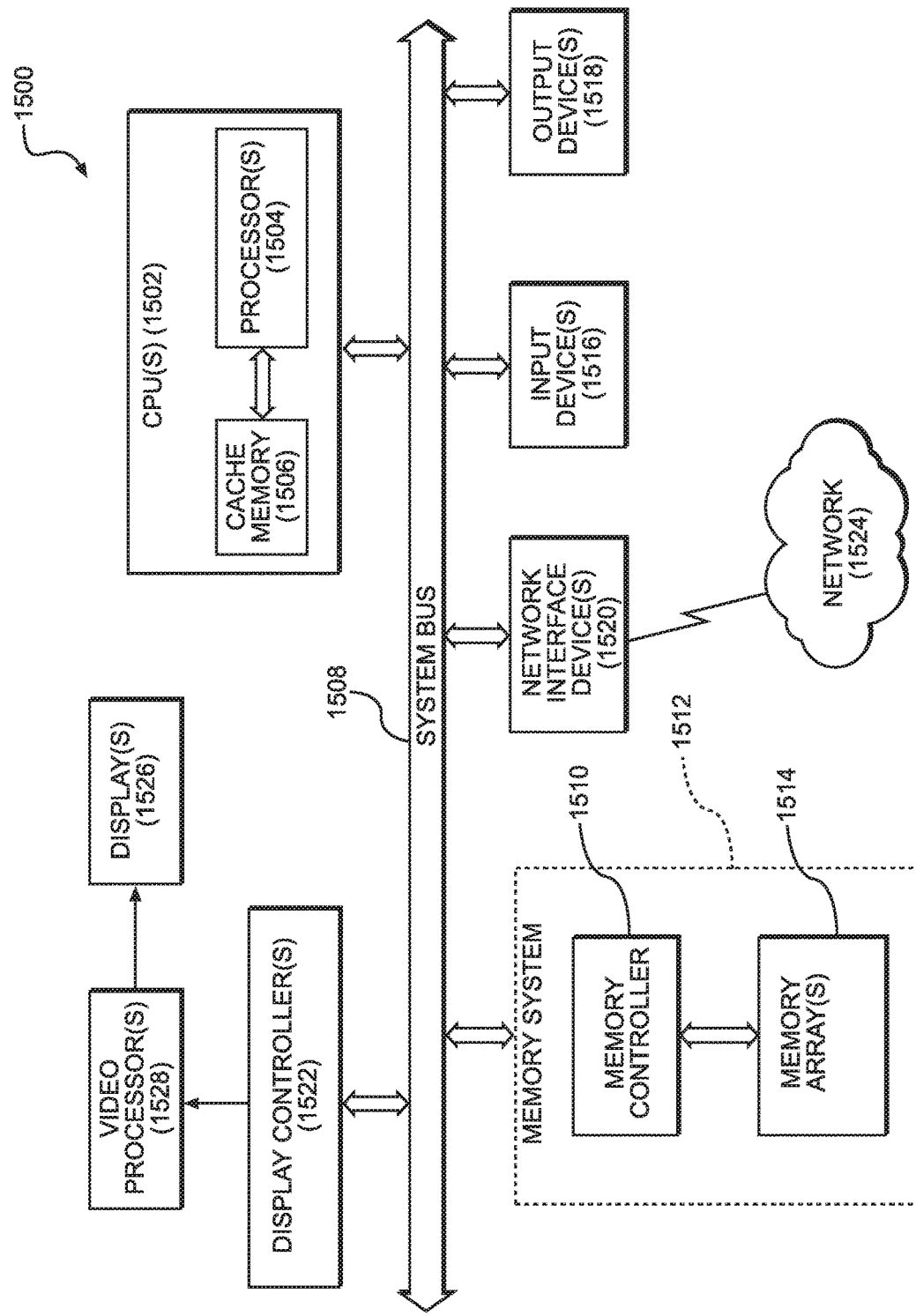
FIG. 15 is a block diagram of an exemplary processor-based system that can include an IC including a complementary cell circuit employing isolation walls for preventing short defects between epitaxial regions, as illustrated in any of FIGS. 4A-4C, 5A-5C, and 12A-14B.

In this regard, FIG. 15 illustrates an example of a processor-based system 1500 including a complementary cell circuit including isolation walls formed between an N-type region and a P-type region to limit growth of P-type epi-S/Ds and N-type epi-S/Ds in a horizontal direction above an isolation region between the N-type region and the P-type region to prevent short defects resulting from process variations in a process for forming epitaxial layers, as illustrated in any of FIGS. 4A-4C, 5A-5C, 13A-13C, and 14A-14B, and according to any aspects disclosed herein. In this example, the processor-based system 1500 includes one or more central processor units (CPUs) 1502, which may also be referred to as CPU or processor cores, each including one or more processors 1504. The CPU(s) 1502 may have cache memory 1506 coupled to the processor(s) 1504 for rapid access to temporarily stored data. As an example, the processor(s) 1504 could include a complementary cell circuit including isolation walls formed between an N-type region and a P-type region to limit growth of P-type epi-S/Ds and N-type epi-S/Ds in a horizontal direction above an isolation region between the N-type region and the P-type region to prevent short defects resulting from process variations in a process for forming epitaxial layers, as illustrated in any of FIGS. 4A-4C, 5A-5C, 13A-13C, and 14A-14B, and according to any aspects disclosed herein. The CPU(s) 1502 is coupled to a system bus 1508 and can intercouple master and slave devices included in the processor-based system 1500. As is well known, the CPU(s) 1502 communicates with these other devices by exchanging address, control, and data information over the system bus 1508. For example, the CPU(s) 1502 can communicate bus transaction requests to a memory controller 1510 as an example of a slave device. Although not illustrated in FIG. 15, multiple system buses 1508 could be provided, wherein each system bus 1508 constitutes a different fabric.

Other master and slave devices can be connected to the system bus 1508. As illustrated in FIG. 15, these devices can include a memory system 1512 that includes the memory controller 1510 and one or more memory arrays 1514, one or more input devices 1516, one or more output devices 1518, one or more network interface devices 1520, and one or more display controllers 1522, as examples. Each of the memory system 1512, the one or more input devices 1516, the one or more output devices 1518, the one or more network interface devices 1520, and the one or more display controllers 1522 can include a complementary cell circuit including isolation walls formed between an N-type region and a P-type region to limit growth of P-type epi-S/Ds and N-type epi-S/Ds in a horizontal direction above an isolation region between the N-type region and the P-type region to prevent short defects resulting from process variations in a process for forming epitaxial layers, as illustrated in any of FIGS. 4A-4C, 5A-5C, 13A-13C, and 14A-14B, and according to any aspects disclosed herein. The input device(s) 1516 can include any type of input device, including, but not limited to, input keys, switches, voice processors, etc. The output device(s) 1518 can include any type of output device, including, but not limited to, audio, video, other visual indicators, etc. The network interface device(s) 1520 can be any device configured to allow exchange of data to and from a network 1524. The network 1524 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1520 can be configured to support any type of communications protocol desired.

The CPU(s) 1502 may also be configured to access the display controller(s) 1522 over the system bus 1508 to control information sent to one or more displays 1526. The display controller(s) 1522 sends information to the display(s) 1526 to be displayed via one or more video processors 1528, which process the information to be displayed into a format suitable for the display(s) 1526. The display(s) 1526 can include any type of display, including, but not limited to, a cathode ray tube (CRT), a liquid crystal display (LCD), a plasma display, a light emitting diode (LED) display, etc. The display controller(s) 1522, display(s) 1526, and/or the video processor(s) 1528 can include a complementary cell circuit including isolation walls formed between an N-type region and a P-type region to limit growth of P-type epi-S/Ds and N-type epi-S/Ds in a horizontal direction above an isolation region between the N-type region and the P-type region to prevent short defects resulting from process variations in a process for forming epitaxial layers, as illustrated in any of FIGS. 4A-4C, 5A-5C, 13A-13C, and 14A-14B, and according to any aspects disclosed herein.

Figure 16:
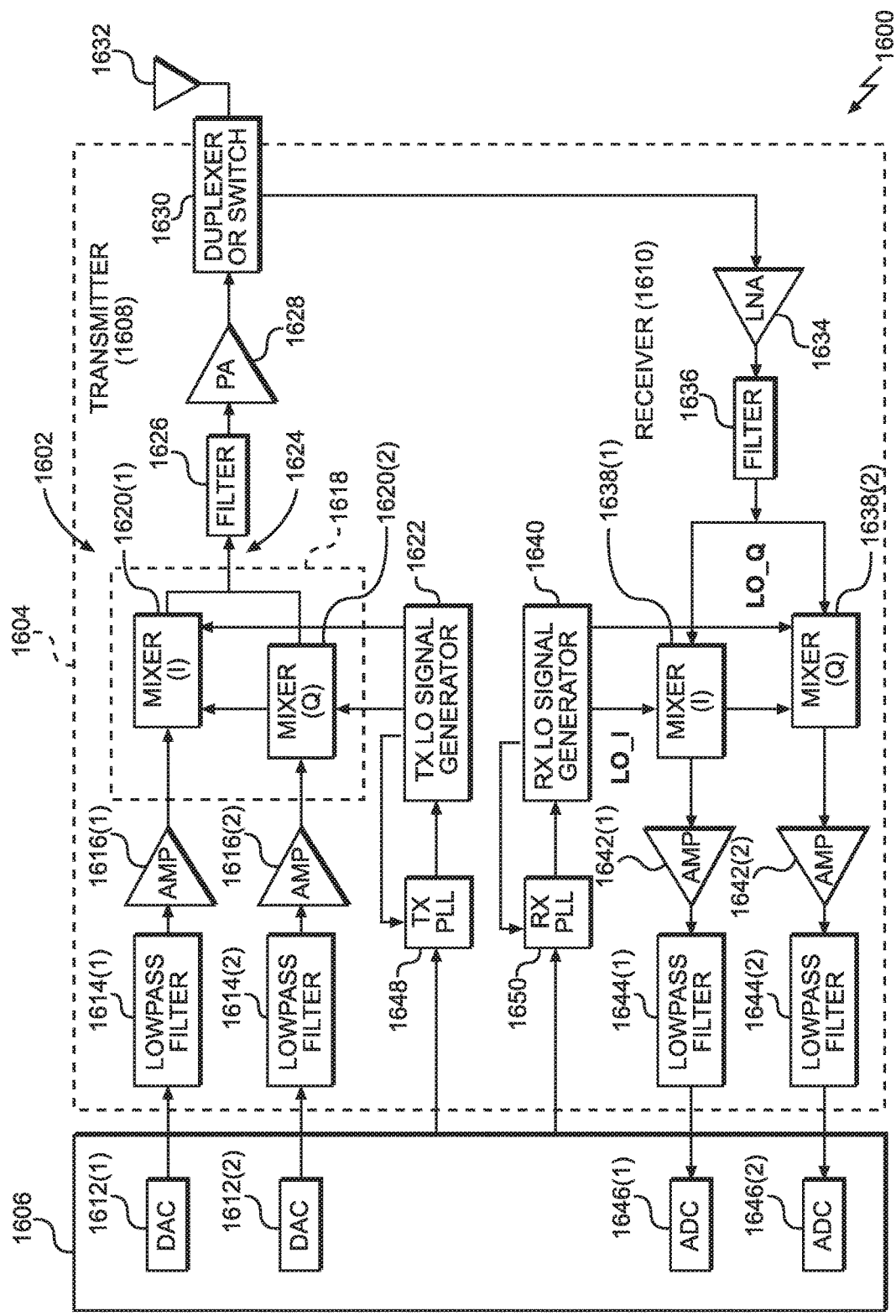
FIG. 16 is a block diagram of an exemplary wireless communications device that includes radio frequency (RF) components formed from an IC, including a complementary cell circuit employing isolation walls for preventing short defects between epitaxial regions, as illustrated in any of FIGS. 4A-4C, 5A-5C, and 12A-14B.

FIG. 16 illustrates an exemplary wireless communications device 1600 that includes radio frequency (RE) components formed from an IC 1602, wherein any of the components therein can include a complementary cell circuit including isolation walls formed between an N-type region and a P-type region to limit growth of P-type epi-S/Ds and N-type epi-S/Ds in a horizontal direction above an isolation region between the N-type region and the P-type region to prevent short defects resulting from process variations in a process for forming epitaxial layers, as illustrated in any of FIGS. 4A-4C, 5A-5C, 13A-13C, and 14A-14B, and according to any aspects disclosed herein. The wireless communications device 1600 may include or be provided in any of the above-referenced devices, as examples. As shown in FIG. 16, the wireless communications device 1600 includes a transceiver 1604 and a data processor 1606. The data processor 1606 may include a memory to store data and program codes. The transceiver 1604 includes a transmitter 1608 and a receiver 1610 that support bi-directional communications. In general, the wireless communications device 1600 may include any number of transmitters 1608 and/or receivers 1610 for any number of communication systems and frequency bands. All or a portion of the transceiver 1604 may be implemented on one or more analog ICs, RF ICs (RFICs), mixed-signal ICs, etc.

The transmitter 1608 or the receiver 1610 may be implemented with a super-heterodyne architecture or a direct-conversion architecture. In the super-heterodyne architecture, a signal is frequency-converted between RF and baseband in multiple stages, e.g., from RE to an intermediate frequency (IF) in one stage, and then from IF to baseband in another stage for the receiver 1610. In the direct-conversion architecture, a signal is frequency-converted between RE and baseband in one stage. The super-heterodyne and direct-conversion architectures may use different circuit blocks and/or have different requirements. In the wireless communications device 1600 in FIG. 16, the transmitter 1608 and the receiver 1610 are implemented with the direct-conversion architecture.

In the transmit path, the data processor 1606 processes data to be transmitted and provides I and Q analog output signals to the transmitter 1608. In the exemplary wireless communications device 1600, the data processor 1606 includes digital-to-analog converters (DACs) 1612(1), 1612(2) for converting digital signals generated by the data processor 1606 into the I and Q analog output signals, e.g., I and Q output currents, for further processing.

Within the transmitter 1608, lowpass filters 1614(1), 1614(2) filter the I and Q analog output signals, respectively, to remove undesired signals caused by the prior digital-to-analog conversion. Amplifiers (AMPs) 1616(1), 1616(2) amplify the signals from the lowpass filters 1614(1), 1614(2), respectively, and provide I and Q baseband signals. An upconverter 1618 upconverts the I and Q baseband signals with I and Q transmit (TX) local oscillator (LO) signals through mixers 1620(1), 1620(2) from a TX LO signal generator 1622 to provide an upconverted signal 1624. A filter 1626 filters the upconverted signal 1624 to remove undesired signals caused by the frequency, upconversion as well as noise in a receive frequency band. A power amplifier (PA) 1628 amplifies the upconverted signal 1624 from the filter 1626 to obtain the desired output power level and provides a transmitted RF signal. The transmitted RF signal is routed through a duplexer or switch 1630 and transmitted via an antenna 1632.

In the receive path, the antenna 1632 receives signals transmitted by base stations and provides a received RF signal, which is routed through the duplexer or switch 1630 and provided to a low noise amplifier (LNA) 1634. The duplexer or switch 1630 is designed to operate with a specific receive (RX)-to-TX duplexer frequency separation, such that RX signals are isolated from TX signals. The received RF signal is amplified by the LNA 1634 and filtered by a filter 1636 to obtain a desired RF input signal. Down-conversion mixers 1638(1), 1638(2) mix the output of the filter 1636 with I and Q RX LO signals (i.e., LO_I and LO_Q) from an RX LO signal generator 1640 to generate I and Q baseband signals. The I and Q baseband signals are amplified by amplifiers (AMPS) 1642(1), 1642(2) and further filtered by lowpass filters 1644(1), 1644(2) to obtain I and Q analog input signals, which are provided to the data processor 1606, In this example, the data processor 1606 includes Analog to Digital Converters (ADCs) 1646(1), 1646(2) for converting the analog input signals into digital signals to be further processed by the data processor 1606.

In the wireless communications device 1600 of FIG. 16, the TX LO signal generator 1622 generates the I and Q TX LO signals used for frequency upconversion, while the RX LO signal generator 1640 generates the I and Q RX LO signals used for frequency downconversion. Each LO signal is a periodic signal with a particular fundamental frequency. A TX phase-locked loop (PLL) circuit 1648 receives timing information from the data processor 1606 and generates a control signal used to adjust the frequency and/or phase of the TX LO signals from the TX LO signal generator 1622. Similarly, an RX PLL circuit 1650 receives timing information from the data processor 1606 and generates a control signal used to adjust the frequency and/or phase of the RX LO signals from the RX LO signal generator 1640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any, combination thereof.

The previous description of the disclosure is provided to enable any person skilled in the art to make or use the disclosure, Various modifications to the disclosure will be readily apparent to those skilled in the art, and the generic principles defined herein may be applied to other variations. Thus, the disclosure is not intended to be limited to the examples and designs described herein hut, is to be accorded the widest scope consistent with the principles and novel features disclosed herein.

What is claimed is:

1. A complementary cell circuit, comprising:
   a semiconductor substrate comprising:
      a P-type region;
      an N-type region; and
      an isolation region between the P-type region and the N-type region, the isolation region having a width extending in a direction of a first axis;
   a gate extending longitudinally in the direction of the first axis, the gate extending across portions of each of the P-type region, the isolation region, and the N-type region;
   a first P-type epitaxial (epi) source/drain (S/D) (epi-S/D) formed on the P-type region on a first side of the gate, the first P-type epi-S/D extending above the isolation region in a first direction of the first axis;
   a first N-type epi-S/D formed on the N-type region on the first side of the gate, the first N-type epi-S/D extending above the isolation region in a second direction of the first axis;
   a first isolation wall on the first side of the gate extending from the isolation region in a third direction orthogonal to the first axis, the first isolation wall isolating the first P-type epi-S/D from the first N-type epi-S/D;
   a second P-type epi-S/D formed on the P-type region on a second side of the gate, the second P-type epi-S/D extending above the isolation region in the first direction of the first axis;
   a second N-type epi-S/D formed on the N-type region on the second side of the gate, the second N-type epi-S/D extending above the isolation region in the second direction of the first axis; and
   a second isolation wall on the second side of the gate extending from the isolation region in the third direction orthogonal to the first axis, the second isolation wall isolating the second P-type epi-S/D from the second N-type epi-S/D.

2. The complementary cell circuit of claim 1, further comprising:
   a gate cut disposed at an end of the gate, the gate cut comprising a material of which the first isolation wall and the second isolation wall are formed.

3. The complementary cell circuit of claim 1, wherein:
   a bottom end of the first isolation wall and a bottom end of the second isolation wall are below a top surface of the isolation region.

4. The complementary cell circuit of claim 2, wherein:
   the material of the gate cut, the first isolation wall, and the second isolation wall comprises at least one of Silicon Nitride (SiN), Silicon Oxi-Nitride (SiON), Silicon Carbide (SiC), and Aluminum Oxide ($Al_2O_3$).

5. The complementary cell circuit of claim 1, wherein:
   the first isolation wall and the second isolation wall each extend longitudinally in a fourth direction orthogonal to the gate.

6. The complementary cell circuit of claim 1, wherein:
   the N-type region comprises an N-type fin extending in the third direction from the semiconductor substrate;
   the first N-type epi-S/D and the second N-type epi-S/D are formed on the N-type fin;
   the P-type region comprises a P-type fin extending in the third direction from the semiconductor substrate; and the first P-type epi-S/D and the second P-type epi-S/D are formed on the P-type fin.

7. The complementary cell circuit of claim 1, wherein:
the first and second N-type epi-S/Ds are formed on at least one N-type gate-all-around (GAA) structure extending longitudinally in a fourth direction orthogonal to the first direction and the third direction;
the first and second P-type epi-S/Ds are formed on at least one P-type GAA structure extending longitudinally in the fourth direction; and
the N-type GAA structure and the P-type GAA structure each comprise a nanosheet, a nanoslab, or a nanowire.

8. The complementary cell circuit of claim 1, wherein:
a planar N-type transistor comprises the first N-type epi-S/D and the second N-type epi-S/D; and
a planar P-type transistor comprises the first P-type epi-S/D and the second P-type epi-S/D.

9. The complementary cell circuit of claim 1 integrated in an integrated circuit (IC).

10. The complementary cell circuit of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A method of forming a complementary cell circuit including isolation structures, the method comprising:
forming a P-type region on a first side of an isolation region extending longitudinally in a first direction on a semiconductor substrate;
forming an N-type region on a second side of the isolation region on the semiconductor substrate;
forming a dummy gate extending longitudinally in a second direction orthogonal to the first direction and extending across portions of the P-type region, the isolation region, and the N-type region;
depositing a dielectric layer on the P-type region, the isolation region, and the N-type region on a first side and a second side of the dummy gate;
etching a first trench through the dielectric layer on the first side of the dummy gate and a second trench through the dielectric layer on the second side of the dummy gate;
forming isolation structures, comprising:
filling the first trench with an isolation material to form a first isolation wall; and
filling the second trench with the isolation material to form a second isolation wall;
forming a first N-type epitaxial (epi) source/drain (S/D) (epi-S/D) on the N-type region on the first side of the dummy gate, the first N-type epi-S/D extending above the isolation region on a first side of the first isolation wall;
forming a second N-type epi-S/D on the N-type region on the second side of the dummy gate, the second N-type epi-S/D extending above the isolation region on a first side of the second isolation wall;
forming a first P-type epi-S/D on the P-type region on the first side of the dummy gate, the first P-type epi-S/D extending above the isolation region on a second side of the first isolation wall and isolated from the first N-type epi-S/D by the first isolation wall; and
forming a second P-type epi-S/D on the P-type region on the second side of the dummy gate, the second P-type epi-S/D extending above the isolation region on a second side of the second isolation wall and isolated from the second N-type epi-S/D by the second isolation wall.

12. The method of claim 11, further comprising:
forming a trench mask on the dielectric layer, comprising:
depositing a trench mask layer; and
patterning the trench mask layer to create openings for forming trenches in the dielectric layer.

13. The method of claim 11, wherein:
etching the first trench through the dielectric layer further comprises etching the first trench into a surface of the isolation region on the first side of the dummy gate; and
etching the second trench through the dielectric layer further comprises etching the second trench into the surface of the isolation region on the second side of the dummy gate.

14. The method of claim 11, wherein:
filling the first trench and the second trench with the isolation material further comprises filling the first trench and the second trench with the isolation material to a height of the dummy gate.

15. The method of claim 11, further comprising:
forming a gate cut mask, comprising:
depositing a gate cut mask layer; and
patterning the gate cut mask layer to create an opening above the dummy gate for forming a trench in the dummy gate.

16. The method of claim 15, further comprising:
etching a gate cut trench through the dummy gate;
wherein forming the isolation structures further comprises filling the gate cut trench with the isolation material to form a gate cut.

17. The method of claim 16, wherein:
filling the gate cut trench with the isolation material further comprises filling the gate cut trench with the isolation material to a height of the dummy gate.

18. The method of claim 11, wherein:
forming the P-type region further comprises forming a P-type planar region on the semiconductor substrate; and
forming the N-type region further comprises forming an N-type planar region on the semiconductor substrate.

19. The method of claim 11, wherein:
forming the P-type region further comprises forming at least one P-type fin extending orthogonally to the semiconductor substrate; and
forming the N-type region further comprises forming at least one N-type fin extending orthogonally to the semiconductor substrate.

20. The method of claim 11, wherein:
forming the P-type region further comprises forming at least one P-type gate-all-around (GAA) structure extending longitudinally in a direction substantially parallel to the semiconductor substrate; and forming the N-type region further comprises forming at least one N-type GAA structure extending longitudinally in a direction substantially parallel to the semiconductor substrate;

wherein a GAA structure comprises a nanosheet, a nanoslab, or a nanowire.

* * * * *